United States Patent
Kirkpatrick et al.

(10) Patent No.: US 10,670,960 B2
(45) Date of Patent: Jun. 2, 2020

(54) ENHANCED HIGH ASPECT RATIO ETCH PERFORMANCE USING ACCELERATED NEUTRAL BEAMS DERIVED FROM GAS-CLUSTER ION BEAMS

(71) Applicant: Exogenesis Corporation, Billerica, MA (US)

(72) Inventors: Sean R. Kirkpatrick, Littleton, MA (US); Kiet A. Chau, North Reading, MA (US); Son T. Chau, Lynn, MA (US)

(73) Assignee: Exogenesis Corporation, Billerica, MA (US)

( * ) Notice: Subject to any disclaimer, the term of this patent is extended or adjusted under 35 U.S.C. 154(b) by 0 days.

(21) Appl. No.: 16/008,573

(22) Filed: Jun. 14, 2018

(65) Prior Publication Data

US 2018/0292745 A1 Oct. 11, 2018

Related U.S. Application Data

(63) Continuation-in-part of application No. 14/466,242, filed on Aug. 22, 2014, now Pat. No. 10,202,684,
(Continued)

(51) Int. Cl.
*H01J 37/00* (2006.01)
*G03F 1/80* (2012.01)
(Continued)

(52) U.S. Cl.
CPC .................. *G03F 1/80* (2013.01); *G03F 1/82* (2013.01); *H01J 37/05* (2013.01); *H01J 37/147* (2013.01);
(Continued)

(58) Field of Classification Search
CPC ........ G03F 1/80; G03F 1/82; H01L 21/31116; H01L 21/02238; H01L 21/02252;
(Continued)

(56) References Cited

U.S. PATENT DOCUMENTS 3,679,897 A    7/1972   Hansen et al.
4,649,273 A *   3/1987   Chutjian ................ B01D 59/44
                                                                 250/251

(Continued)

FOREIGN PATENT DOCUMENTS

WO     2012103229 A1    8/2012

OTHER PUBLICATIONS

International Search Report dated Dec. 22, 2011 for International Application No. PCT/US11/48754.
(Continued)

*Primary Examiner* — Michael Maskell
(74) *Attorney, Agent, or Firm* — Burns & Levinson LLP; Jerry Cohen

(57) ABSTRACT

A method of processing a trench, via, hole, recess, void, or other feature that extends a depth into a substrate to a base or bottom and has an opening with high aspect ratio (into depth from opening to base or bottom divided by minimum space of the trench therebetween) by irradiation with an accelerated neutral beam derived from an accelerated gas cluster ion beam for processing materials at the base or bottom of the opening.

13 Claims, 27 Drawing Sheets

Related U.S. Application Data which is a continuation-in-part of application No. PCT/US2013/027512, filed on Feb. 2, 2013, said application No. 14/466,242 is a continuation of application No. 13/215,514, filed on Aug. 23, 2011, now Pat. No. 8,847,148.

(60) Provisional application No. 62/519,389, filed on Jun. 14, 2017, provisional application No. 61/601,980, filed on Feb. 22, 2012, provisional application No. 61/650,747, filed on May 23, 2012, provisional application No. 61/658,522, filed on Jun. 12, 2012, provisional application No. 61/376,225, filed on Aug. 23, 2010, provisional application No. 61/473,359, filed on Apr. 8, 2011, provisional application No. 61/484,421, filed on May 10, 2011, provisional application No. 61/490,675, filed on May 27, 2011.

(51) Int. Cl.
| | | |
|---|---|---|
| *H01J 37/317* | (2006.01) | |
| *H01L 21/311* | (2006.01) | |
| *H01L 21/265* | (2006.01) | |
| *H01L 21/02* | (2006.01) | |
| *G03F 1/82* | (2012.01) | |
| *H05H 3/02* | (2006.01) | |
| *H01J 37/147* | (2006.01) | |
| *H01J 37/05* | (2006.01) | |
| *H01J 37/32* | (2006.01) | |
| *H01L 29/36* | (2006.01) | |
| *B24B 37/04* | (2012.01) | |

(52) U.S. Cl.
CPC ........ *H01J 37/317* (2013.01); *H01J 37/3171* (2013.01); *H01J 37/32816* (2013.01); *H01L 21/02115* (2013.01); *H01L 21/02238* (2013.01); *H01L 21/02252* (2013.01); *H01L 21/02274* (2013.01); *H01L 21/26506* (2013.01); *H01L 21/26513* (2013.01); *H01L 21/26566* (2013.01); *H01L 21/31105* (2013.01); *H01L 21/31111* (2013.01); *H01L 21/31116* (2013.01); *H05H 3/02* (2013.01); *B24B 37/04* (2013.01); *H01J 2237/0041* (2013.01); *H01J 2237/0812* (2013.01); *H01J 2237/15* (2013.01); *H01L 29/36* (2013.01); *Y10T 428/24355* (2015.01); *Y10T 428/24479* (2015.01); *Y10T 428/30* (2015.01)

(58) Field of Classification Search
CPC ......... H01L 21/31111; H01L 21/31105; H01L 21/26566; H01L 21/26513; H01L 21/26506; H01L 21/02274; H01L 21/02115; H01L 29/36; H01J 37/32816; H01J 37/317; H01J 37/147; H01J 37/3171; H01J 37/05; H01J 2237/15; H01J 2237/0812; H01J 2237/0041; H05H 3/02; B24B 37/04; Y10T 428/24479; Y10T 428/24355; Y10T 428/30
USPC .............................................. 250/492.1, 251
See application file for complete search history.

(56) References Cited

U.S. PATENT DOCUMENTS

| 4,713,542 | A | * | 12/1987 | Campana | .................. | G21K 1/14 |
| | | | | | | 250/251 |
| 4,775,789 | A | * | 10/1988 | Albridge, Jr. | ............ | G21K 1/14 |
| | | | | | | 250/251 |
| 4,812,663 | A | * | 3/1989 | Douglas-Hamilton | ...................... |
| | | | | | | G01T 1/12 |
| | | | | | | 250/443.1 |
| 4,935,623 | A | * | 6/1990 | Knauer | ................... | H05H 3/02 |
| | | | | | | 118/715 |
| 6,486,478 | B1 | | 11/2002 | Libby et al. | | |
| 6,491,800 | B2 | | 12/2002 | Kirkpatrick et al. | | |
| 6,635,883 | B2 | | 10/2003 | Torti et al. | | |
| 6,676,989 | B2 | | 1/2004 | Kirkpatrick et al. | | |
| 6,812,147 | B2 | | 11/2004 | Skinner et al. | | |
| 7,060,989 | B2 | | 6/2006 | Swenson et al. | | |
| 7,105,199 | B2 | | 9/2006 | Blinn et al. | | |
| 7,115,511 | B2 | | 10/2006 | Hautala | | |
| 7,247,845 | B1 | | 7/2007 | Gebhardt et al. | | |
| 2001/0054686 | A1 | * | 12/2001 | Torti | .................... | H01J 27/026 |
| | | | | | | 250/288 |
| 2003/0021908 | A1 | | 1/2003 | Nickel et al. | | |
| 2003/0026990 | A1 | | 2/2003 | Yamada et al. | | |
| 2005/0205802 | A1 | * | 9/2005 | Swenson | ............... | H01J 27/026 |
| | | | | | | 250/423 R |
| 2005/0277246 | A1 | * | 12/2005 | Kirkpatrick | ............. | H01J 37/08 |
| | | | | | | 438/232 |
| 2006/0043317 | A1 | | 3/2006 | Ono et al. | | |
| 2006/0097185 | A1 | * | 5/2006 | Mack | ..................... | H01J 27/026 |
| | | | | | | 250/423 R |
| 2006/0278611 | A1 | * | 12/2006 | Sato | ........................ | C23F 4/00 |
| | | | | | | 216/66 |
| 2007/0099438 | A1 | * | 5/2007 | Ye | ......................... | C23C 14/345 |
| | | | | | | 438/778 |
| 2007/0185488 | A1 | | 8/2007 | Pohjonen | | |
| 2008/0169416 | A1 | | 7/2008 | Thompson et al. | | |
| 2008/0179537 | A1 | * | 7/2008 | Saito | ....................... | H01J 37/08 |
| | | | | | | 250/427 |
| 2008/0245974 | A1 | * | 10/2008 | Kirkpatrick | ............. | H01J 37/08 |
| | | | | | | 250/492.21 |
| 2009/0074834 | A1 | | 3/2009 | Kirkpatrick et al. | | |
| 2009/0087578 | A1 | | 4/2009 | Hautala | | |
| 2009/0140165 | A1 | * | 6/2009 | Hautala | ................. | H01J 27/026 |
| | | | | | | 250/427 |
| 2009/0321658 | A1 | | 12/2009 | Kirkpatrick et al. | | |
| 2010/0036482 | A1 | | 2/2010 | Svrluga et al. | | |
| 2010/0226958 | A1 | * | 9/2010 | Khoury | ............... | A61L 27/3604 |
| | | | | | | 424/423 |
| 2010/0227523 | A1 | | 9/2010 | Khoury et al. | | |
| 2010/0261040 | A1 | * | 10/2010 | Foad | ...................... | B82Y 10/00 |
| | | | | | | 428/800 |
| 2011/0240602 | A1 | * | 10/2011 | Becker | .................... | H01J 37/08 |
| | | | | | | 216/94 |
| 2011/0300599 | A1 | * | 12/2011 | Khoury | ................... | A61L 27/18 |
| | | | | | | 435/180 |
| 2012/0045615 | A1 | | 2/2012 | Kirkpatrick et al. | | |
| 2012/0161037 | A1 | * | 6/2012 | Farley | ............... | H01J 37/32412 |
| | | | | | | 250/492.3 |
| 2014/0236286 | A1 | | 8/2014 | Kirkpatrick | | |
| 2014/0272179 | A1 | * | 9/2014 | Radovanov | ....... | H01J 37/32357 |
| | | | | | | 427/523 |

OTHER PUBLICATIONS

Written Opinion dated Dec. 22, 2011 for International Application No. PCT/US11/48754.

Wegner, et al. (2006), "Gas-phase synthesis of nanostructured particulate films", KONA Powder and Particle, 24, 54-69.

Toyoda, N. et al. "Cluster size dependence on energy and velocity distributions of gas cluster ions after collisions with residual gas," Nuclear Instruments and Methods in Physics Research B 257 (2007), pp. 662-665.

Swenson, D.R. "Measurement of averages of charge, energy and mass of large, multiply charged cluster ions colliding with atoms," Nuclear Instruments and Methods in Physics Research B 222 (2004), pp. 61-67.

Houzumi, S. et al. "Scanning Tunneling Microscopy Observation of Graphite Surfaces Irradiated with Size-Selected Ar Cluster Ion Beams, " Japanese Journal of Applied Physics, vol. 44, No. 8 (2005), pp. 6252-6254.

(56) References Cited

OTHER PUBLICATIONS

Holmes, A.J.T., "Theoretical and experimental study of space charge in intense ion beams," Phys. Rev. A, vol. 19(1), 1979, pp. 389-407.
Humpries, Jr., S. "Charged Particle Beams," Chapter II: Ion Beam Neutralization, pp. 501-534 (1990), Wiley-Interscience ISBN 0-471-60014-8.
Supplementary European Search Report, Application No. EP 11 82 0497, dated Jun. 23, 2016, Examiner Schmidt-Karst, S.
Kirkpatrick, A. Gas cluster ion beam applications and equipment, Nuclear instruments & Methods in Physics Research, Section B: Beam Interactions with Materialsand Atoms, Elsevier BV, NL, vol. 206, May 1 May 1, 2003, pp. 830-837, XP004425939, ISSN: 0168-583X, DOI: 10.101/S0168-583X(03)00858-9, pp. 830-831.
Gardener, JE et al. "A large area thermal detector for fast neutral particles", Journal of Physics E: Scientific Instruments, vol. 5, No 1, XP001446152, Jul. 1, 1972 (Jul. 1, 1972), pp. 712-714
Kirkpatrick et al. "Enhanced High Aspect Ratio Etch Performance with ANAB Technology", Exogenesis Corporation, 2016, 6 pages.

* cited by examiner

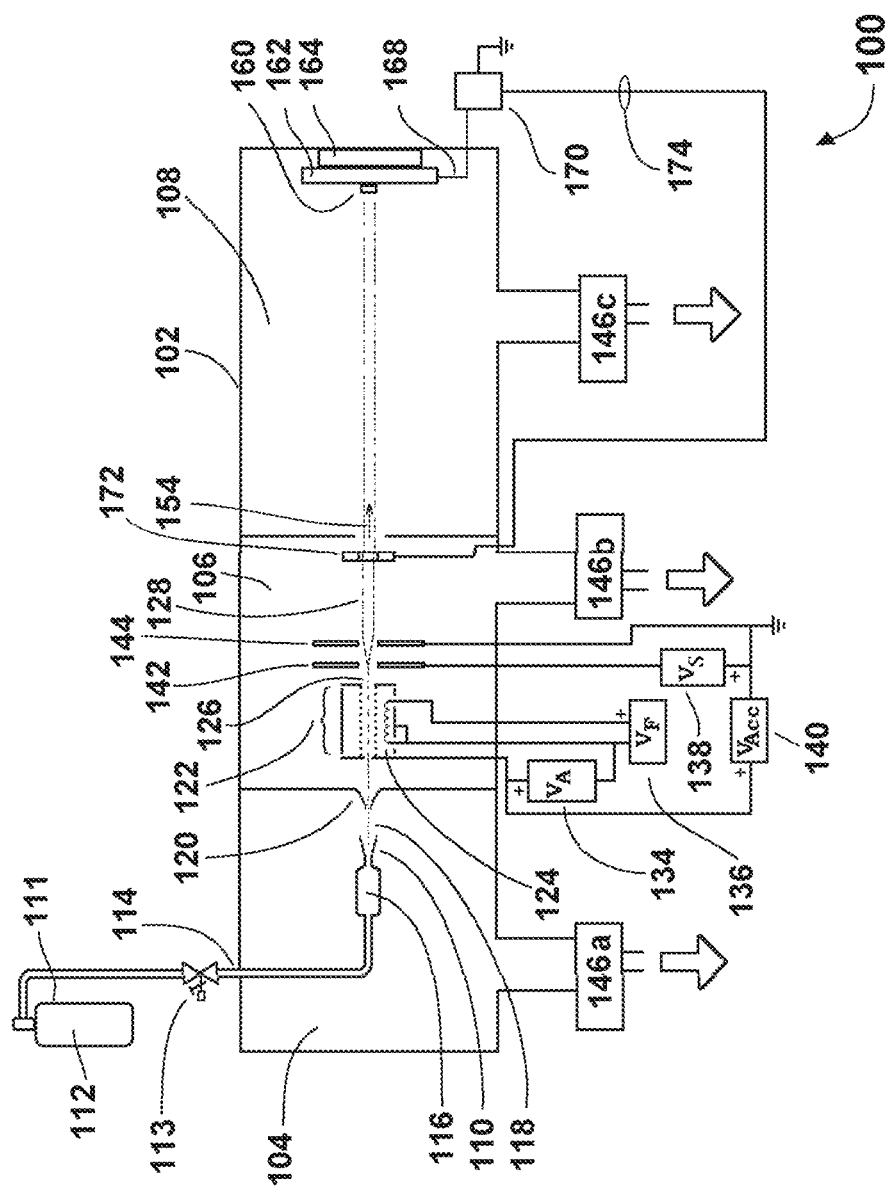
FIGURE 1C- PRIOR ART

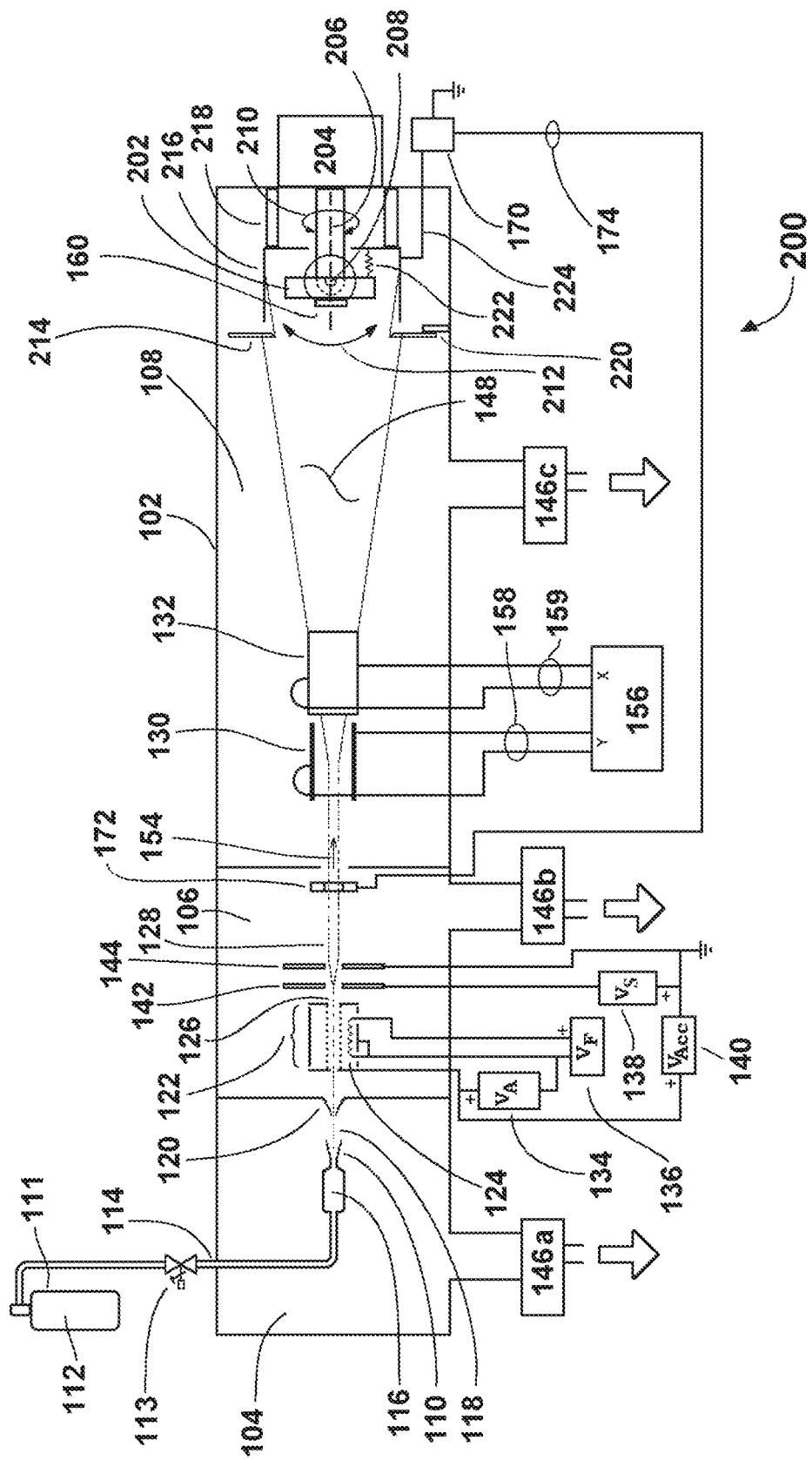
FIGURE 2 - PRIOR ART

ENHANCED HIGH ASPECT RATIO ETCH PERFORMANCE USING ACCELERATED NEUTRAL BEAMS DERIVED FROM GAS-CLUSTER ION BEAMS

RELATED APPLICATIONS

This application claims priority from Provisional Application No. 62/519,389, filed Jun. 14, 2017 and is a continuation-in-part of U.S. patent application Ser. No. 14/466,242, filed Aug. 22, 2014, which is in turn a continuation-in-part of PCT/US13/27515, filed Feb. 2, 2013 which in turn claims benefit of U.S. Provisional Applications 61/601,980, filed Feb. 22, 2012; 61/650,747, filed May 23, 2012 and 61/658,522, filed Jun. 12, 2012. The present application is a continuation-in-part of U.S. patent application Ser. No. 14/466,242, filed Aug. 22, 2014, which is a continuation-in-part of U.S. patent application Ser. No. 13/215,514, filed Aug. 23, 2011, which claims priority of U.S. Provisional Applications 61/376,225, filed Aug. 23, 2010; 61/473,359, filed Apr. 8, 2011; 61/484,421, filed May 10, 2011; and 61/490,675, filed May 27, 2011. The entire contents of all these applications being incorporated herein by reference as though set out at length herein.

BACKGROUND

As semiconductor and MEMS device density increase according commercial demand for more complex, higher performance devices, three dimensional device features often at the base or bottom of a cavity deep within a material object (such as trenches, vias, slits and holes and the like, all referred to herein as "trenches" unless otherwise specified). The base or bottom of a trench can be the material of the body containing the trench or a den object placed in the trench bottom such as an electronic device or substrate or other object to be surface modified.

Increasingly high aspect ratios (depth of the trench to minimum width span diameter therein from a top (proximate) opening to deep into the interior base or bottom (distal) location) have become necessary. The "base or bottom" can be a true base or bottom of the trench or a synthetic bottom such as a shelf or grid within a bench constitutional or supporting a device to be processed but still very deep in the trench in such case the latter is the base or bottom referenced to herein. Aspect ratio is the depth from proximate opening of the trench to its distal base or bottom dividing minimum span of the trench therebetween. Device manufacture involves multiple material deposition cycles combined with lithographic processing of photoresist layers to form patterned masks that protect necessary device layer material while allowing all other material to be selectively removed. Gas phase ion etch reactions, also known as 'dry etch' may be used to perform the selective material removal process. Dry etch technology typically involves halogens such as fluorides, chlorides or other reactive species combined with charged particle technology to form reactive radicals. An ion-assisted reaction is a phenomenon in which the incoming ions enhance the surface reactions [1]. The reactive species interact with target material surfaces forming volatile compounds that are released from the surface and pumped away. High aspect ratio dry etch technology is necessitated when physical sputtering of pattern mask material is the limiting factor for high aspect ratio target material removal. In order to effectively process at increasingly high aspect ratios, the following technology performance criteria must be met:

1) Energy Range: Highly controllable flux energies are required so as to minimize sputtering of mask materials while simultaneously enabling delivery of reactive species to high aspect target locations. Typical particle energies for dry etch applications are less than a few hundred eV.

2) Process Beam Divergence: As aspect ratios continue to increase either by narrowing of the feature width or increasing the feature depth, the likelihood of beam interaction with the feature sidewall increases dramatically. Bowing is a phenomenon in which the etch profile becomes barrel-shaped because of side etching at the middle of the hole caused by scattered ions hitting the sidewalls [2]. Beam perpendicularity to the feature bottom and low divergence trajectory are necessary to maintain critical feature geometry and feature sidewall shape.

3) Surface Charge Accumulation: As layer dimensions continue to be minimized, increasingly stringent voltage budget requirements for device fabrication will be required. Gate oxide breakdown is becoming a serious problem as the gate oxides become thinner [3]. Charge accumulation and capacitive breakdowns through insulating device layers greatly reduce process yields. Additionally, it is extremely difficult to control charge accumulations at the bottoms of high aspect ratio features (holes), causing potential for device damage and repulsion of arriving process species leading to process variability.

4) Reactive Species: Reactive gas species must make contact with target material in order to combine and create volatile materials. This is done either of two ways: Either via high concentration background gas incorporation into the process chamber and then irradiation with the energetic beam to form radicals or alternatively, reactive elements are incorporated into the energetic beam for delivery into the high aspect ratio feature.

Traditional charged particle beams and plasmas combined with chemically reactive species have been used to etch material surfaces. However, as feature aspect ratios continue to increase towards 100:1 preferably 200:1 and beyond, traditional charged particle technologies may be unable to meet these stringent process criteria going forward. Beam blowup is the repulsion of particles of like charge from each other, particularly at low energies such as those required for ion beam processing. For this reason, charged particle beams, like plasmas, may have divergent trajectories that can degrade side wall geometries of high aspect ratio features. Surface charging effects on the substrate surface or within the high aspect ratio feature can further exacerbate issues related to charge repulsion effects on sidewall straightness and process repeatability. It is also recognized that the charges associated with ion technologies may ultimately damage device layers due to charge accumulation and capacitive discharging through insulating device layers. Efforts to neutralize the ion beams and substrates by addition of neutralizing electrons add process complexity and are difficult to accurately control in high aspect ratio features (see FIG. 1).

SUMMARY OF THE INVENTION

U.S. Pat. Nos. 8,847,148 and 8,629,393, both incorporated herein by reference, teach respectively methods and apparatus for generation of accelerated neutral beams derived from accelerated and dissociated gas-cluster ion beams, hereinafter sometimes referred to as "ANAB." ANAB can provide intense, highly collimated beams of neutral (non-ionized) monomers with adjustable and controllable energies in the range from less than 10 eV to greater than a few hundred eV that are particularly well suited for high aspect ratio etching applications for the following reasons: ANAB are not subject to charge repulsion effects and can be transported long distances in highly collimated low divergence fashion. This is advantageous for processing at the bottom of high aspect features while minimizing side wall damage and maintaining critical dimensional tolerances. Any condensable gaseous species may be incorporated into ANAB to be delivered in into high aspect ratio features, thereby mitigating the need for high concentration backgrounds of hazardous or corrosive gases, minimizing attack on tool materials and increasing safety. Halogens, for examples, $Cl_2$, $F_2$, $NF_3$ and $SF_6$ alone or in combination with other species such as $N_2$, $O_2$, and $CH_4$ are readily incorporated into source gases for ANAB generation to form ANAB comprising reactive constituents. ANAB can process both conductive and insulating layer materials without need for neutralization measures. This greatly simplifies processing and provides for highly repeatable, damage free processing (see FIG. 1B).

Other objects, features and advantages of the present invention will be apparent from the following Detailed Description in conjunction with the accompanying drawings.

Per U.S. Pat. No. 8,847,148, the present invention provides a high beam purity method and system for deriving from an accelerated gas cluster ion beam an accelerated neutral gas cluster and/or preferably monomer beam that can be employed for a variety of types of surface and shallow subsurface materials processing and which is capable, for many applications, of superior performance compared to conventional GCIB processing. It can provide well-focused, accelerated, intense neutral monomer beams with particles having energies in the range of from about 1 eV to as much as a few thousand eV. In this energy range neutral particles can be beneficial or necessary in many applications, for example when it is desirable to break surface or shallow subsurface bonds to facilitate cleaning, etching, smoothing, deposition, amorphization, or to produce surface chemistry effects. In such cases, energies of from about an eV up to a few thousands of eV per particle can often be useful. This is an energy range in which it has been impractical with simple, relatively inexpensive apparatus to form intense neutral beams. In various embodiments, the accelerated Neutral Beam is employed for a variety of surface and shallow subsurface materials processing and to make enhanced materials and devices by such processing methods.

BRIEF DESCRIPTION OF THE DRAWINGS

FIG. 1C (prior art) is a schematic illustrating elements of a prior art apparatus for processing a workpiece using a GCIB;

FIG. 2 is a schematic illustrating elements of another prior art apparatus for workpiece processing using a GCIB, wherein scanning of the ion beam and manipulation of the workpiece is employed;

DETAILED DESCRIPTION OF PREFERRED EMBODIMENTS

ANAB average energies per monomer and ANAB fluxes may be characterized by using a fixed orifice device that combines a thermopile to measure total power carried by the beam and an ion gauge pressure sensor calibrated for mass flow to measure the arriving monomer flux.

Three approaches are available for controlling the average energy of ANAB monomers.

The first is to control the size distribution of the clusters from which the ANAB monomers are generated. Cluster size can be altered by varying the flow of gas through the nozzle, with higher gas flows producing larger cluster sizes. As an example, if a 1000 monomer cluster is accelerated to 30 keV, then the energy per monomer is 30 eV. Similarly, if a 2000 monomer cluster is accelerated to 30 keV, then the energy per monomer will be 15 eV.

The second method for controlling average ANAB monomer energy is to vary the accelerating field voltage. A third approach to controlling average energy is by varying the nozzle shape and dimensions.

Typical ANAB fluxes range up to $1 \times 10^{17}$ monomers per $cm^2$ per second in beams approximately 1 cm in diameter. For many applications argon gas is used, but any gaseous species can be used alone or combined with argon.

ANAB technology can provide enabling processing capabilities for next generation device manufacturing due to its truly neutral nature. Traditional charged particle technologies attempt to provide neutral surface processing by addition of a space charge or surface charging compensating electron flux. However, even a space or surface neutralized ion flux cannot match the performance and simplicity of the ANAB for many applications. ANAB provides highly controllable nano-scale depth surface modifications while simultaneously offering truly charge free processing capability. This combination of desirable properties can be used to satisfy next generation etch applications with extremely stringent demands such as those required for high aspect ratio etch of 3D surface features.

Figure 1A:
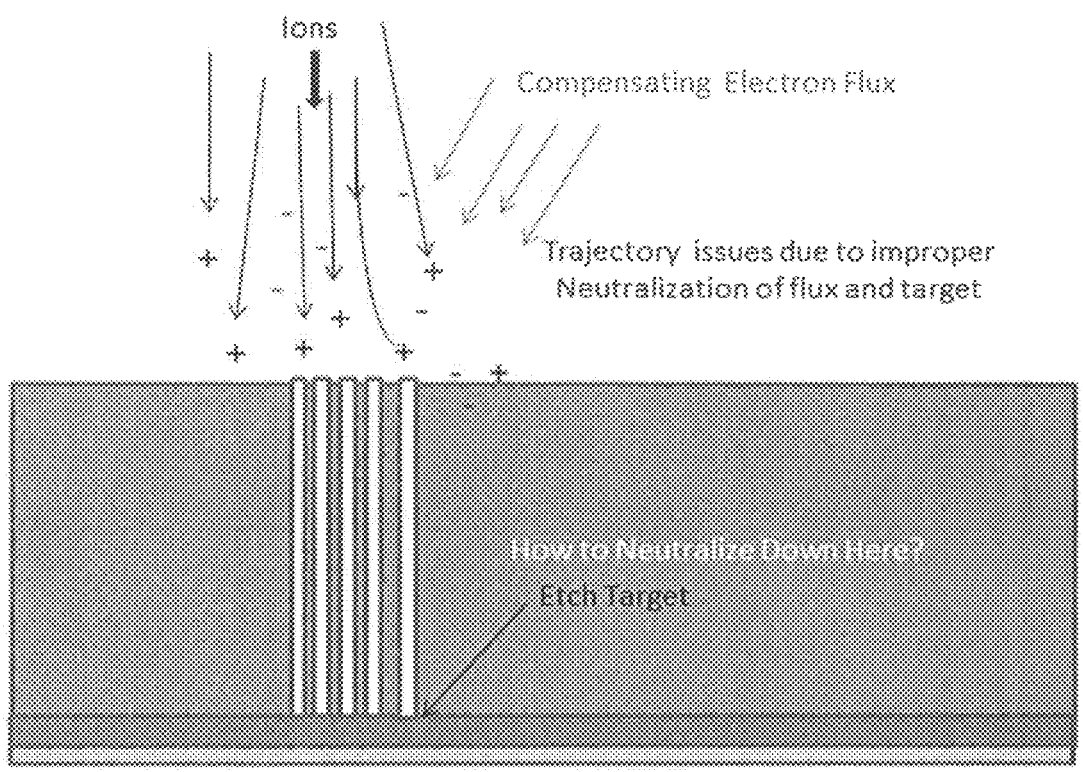
FIG. 1A (prior art) is an explanatory sketch which high aspect sketching with traditional charged part to technology as discussed above.
Figure 1B:
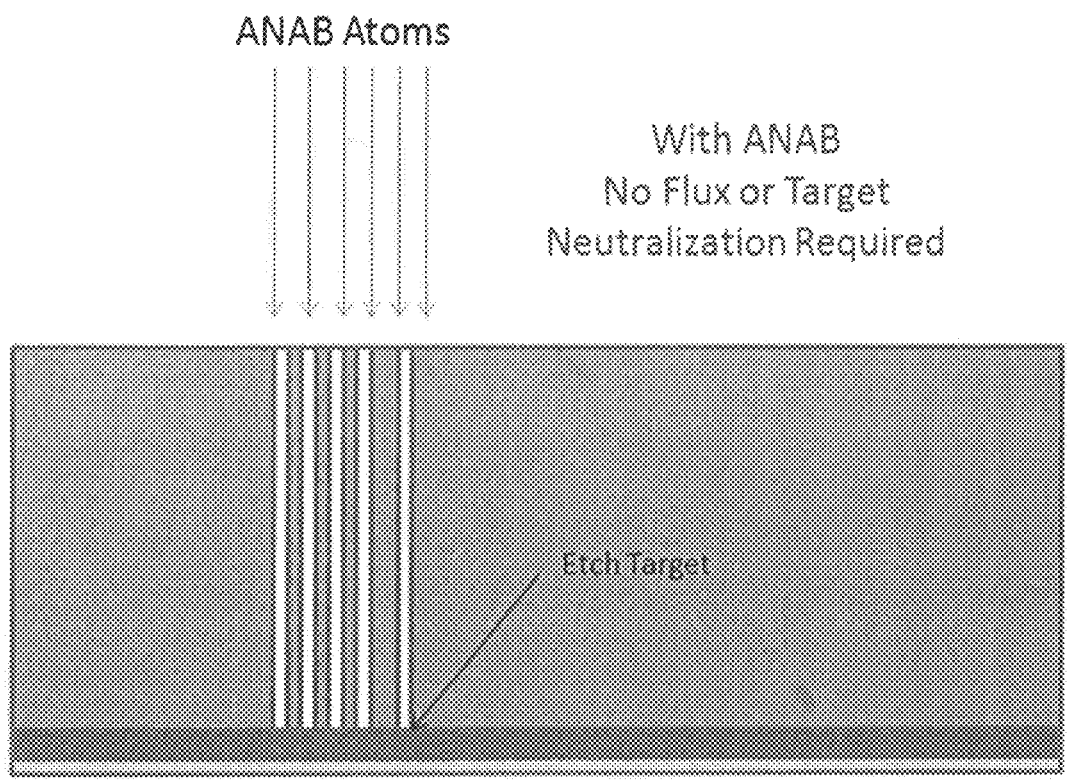
FIG. 1B is an explanatory sketch of high aspect ratio sketching with ANAB (defined below) technology.

Implementation of embodiments of the method and of apparatus are shown as follows:

Reference is now made to FIG. 1A, which shows a schematic configuration for a prior art GCIB processing apparatus 100. A low-pressure vessel 102 has three fluidly connected chambers: a nozzle chamber 104, an ionization/acceleration chamber 106, and a processing chamber 108. The three chambers are evacuated by vacuum pumps 146a, 146b, and 146c, respectively. A pressurized condensable source gas 112 (for example argon) stored in a gas storage cylinder 111 flows through a gas metering valve 113 and a feed tube 114 into a stagnation chamber 116. Pressure (typically a few atmospheres) in the stagnation chamber 116 results in ejection of gas into the substantially lower pressure vacuum through a nozzle 110, resulting in formation of a supersonic gas jet 118. Cooling, resulting from the expansion in the jet, causes a portion of the gas jet 118 to condense into clusters, each consisting of from several to several thousand weakly bound atoms or molecules. A gas skimmer aperture 120 is employed to control flow of gas into the downstream chambers by partially separating gas molecules that have not condensed into a cluster jet from the cluster jet. Excessive pressure in the downstream chambers can be detrimental by interfering with the transport of gas cluster ions and by interfering with management of the high voltages that may be employed for beam formation and transport. Suitable condensable source gases 112 include, but are not limited to argon and other condensable noble gases, nitrogen, carbon dioxide, oxygen, and many other gases and/or gas mixtures. After formation of the gas clusters in the supersonic gas jet 118, at least a portion of the gas clusters are ionized in an ionizer 122 that is typically an electron impact ionizer that produces electrons by thermal emission from one or more incandescent filaments 124 (or from other suitable electron sources) and accelerates and directs the electrons, enabling them to collide with gas clusters in the gas jet 118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 142, and grounded electrode 144 extract the cluster ions from the ionizer exit aperture 126, accelerate them to a desired energy (typically with acceleration potentials of from several hundred V to several tens of kV), and focuses them to form a GCIB 128. The region that the GCIB 128 traverses between the ionizer exit aperture 126 and the suppressor electrode 142 is referred to as the extraction region. The axis (determined at the nozzle 110), of the supersonic gas jet 118 containing gas clusters is substantially the same as the axis 154 of the GCIB 128. Filament power supply 136 provides filament voltage $V_f$ to heat the ionizer filament 124. Anode power supply 134 provides anode voltage $V_A$ to accelerate thermoelectrons emitted from filament 124 to cause the thermoelectrons to irradiate the cluster-containing gas jet 118 to produce cluster ions. A suppression power supply 138 supplies suppression voltage $V_S$ (on the order of several hundred to a few thousand volts) to bias suppressor electrode 142. Accelerator power supply 140 supplies acceleration voltage $V_{Acc}$ to bias the ionizer 122 with respect to suppressor electrode 142 and grounded electrode 144 so as to result in a total GCIB acceleration potential equal to $V_{Acc}$. Suppressor electrode 142 serves to extract ions from the ionizer exit aperture 126 of ionizer 122 and to prevent undesired electrons from entering the ionizer 122 from downstream, and to form a focused GCIB 128.

A workpiece 160, which may (for example) be a medical device, a semiconductor material, an optical element, or other workpiece to be processed by GCIB processing, is held on a workpiece holder 162, that disposes the workpiece in the path of the GCIB 128. The workpiece holder is attached to but electrically insulated from the processing chamber 108 by an electrical insulator 164. Thus, GCIB 128 striking the workpiece 160 and the workpiece holder 162 flows through an electrical lead 168 to a dose processor 170. A beam gate 172 controls transmission of the GCIB 128 along axis 154 to the workpiece 160. The beam gate 172 typically has an open state and a closed state that is controlled by a linkage 174 that may be (for example) electrical, mechanical, or electromechanical. Dose processor 170 controls the open/closed state of the beam gate 172 to manage the GCIB dose received by the workpiece 160 and the workpiece holder 162. In operation, the dose processor 170 opens the beam gate 172 to initiate GCIB irradiation of the workpiece 160. Dose processor 170 typically integrates GCIB electrical current arriving at the workpiece 160 and workpiece holder 162 to calculate an accumulated GCIB irradiation dose. At a predetermined dose, the dose processor 170 closes the beam gate 172, terminating processing when the predetermined dose has been achieved.

In the following description, for simplification of the drawings, item numbers from earlier figures may appear in subsequent figures without discussion. Likewise, items discussed in relation to earlier figures may appear in subsequent figures without item numbers or additional description. In such cases items with like numbers are like items and have the previously described features and functions and illustration of items without item numbers shown in the present figure refer to like items having the same functions as the like items illustrated in earlier numbered figures.

FIG. 1C (prior art) shows a schematic illustrating elements of another prior art GCIB processing apparatus 200 for workpiece processing using a GCIB, wherein scanning of the ion beam and manipulation of the workpiece is employed. A workpiece 160 to be processed by the GCIB processing apparatus 200 is held on a workpiece holder 202, disposed in the path of the GCIB 128. In order to accomplish uniform processing of the workpiece 160, the workpiece holder 202 is designed to manipulate workpiece 160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 202 can be fully articulated for orienting all non-planar surfaces to be processed in suitable alignment with the GCIB 128 to provide processing optimization and uniformity. More specifically, when the workpiece 160 being processed is non-planar, the workpiece holder 202 may be rotated in a rotary motion 210 and articulated in articulation motion 212 by an articulation/rotation mechanism 204. The articulation/rotation mechanism 204 may permit 360 degrees of device rotation about longitudinal axis 206 (which is coaxial with the axis 154 of the GCIB 128) and sufficient articulation about an axis 208 perpendicular to axis 206 to maintain the workpiece surface to within a desired range of beam incidence.

Under certain conditions, depending upon the size of the workpiece 160, a scanning system may be desirable to produce uniform irradiation of a large workpiece. Although often not necessary for GCIB processing, two pairs of orthogonally oriented electrostatic scan plates 130 and 132 may be utilized to produce a raster or other scanning pattern over an extended processing area. When such beam scanning is performed, a scan generator 156 provides X-axis scanning signal voltages to the pair of scan plates 132 through lead pair 159 and Y-axis scanning signal voltages to the pair of scan plates 130 through lead pair 158. The scanning signal voltages are commonly triangular waves of different frequencies that cause the GCIB 128 to be converted into a scanned GCIB 148, which scans the entire surface of the workpiece 160. A scanned beam-defining aperture 214 defines a scanned area. The scanned beam-defining aperture 214 is electrically conductive and is electrically connected to the low-pressure vessel 102 wall and supported by support member 220. The workpiece holder 202 is electrically connected via a flexible electrical lead 222 to a faraday cup 216 that surrounds the workpiece 160 and the workpiece holder 202 and collects all the current passing through the defining aperture 214. The workpiece holder 202 is electrically isolated from the articulation/rotation mechanism 204 and the faraday cup 216 is electrically isolated from and mounted to the low-pressure vessel 102 by insulators 218. Accordingly, all current from the scanned GCIB 148, which passes through the scanned beam-defining aperture 214 is collected in the faraday cup 216 and flows through electrical lead 224 to the dose processor 170. In operation, the dose processor 170 opens the beam gate 172 to initiate GCIB irradiation of the workpiece 160. The dose processor 170 typically integrates GCIB electrical current arriving at the workpiece 160 and workpiece holder 202 and faraday cup 216 to calculate an accumulated GCIB irradiation dose per unit area. At a predetermined dose, the dose processor 170 closes the beam gate 172, terminating processing when the predetermined dose has been achieved. During the accumulation of the predetermined dose, the workpiece 160 may be manipulated by the articulation/rotation mechanism 204 to ensure processing of all desired surfaces.

Figure 3:
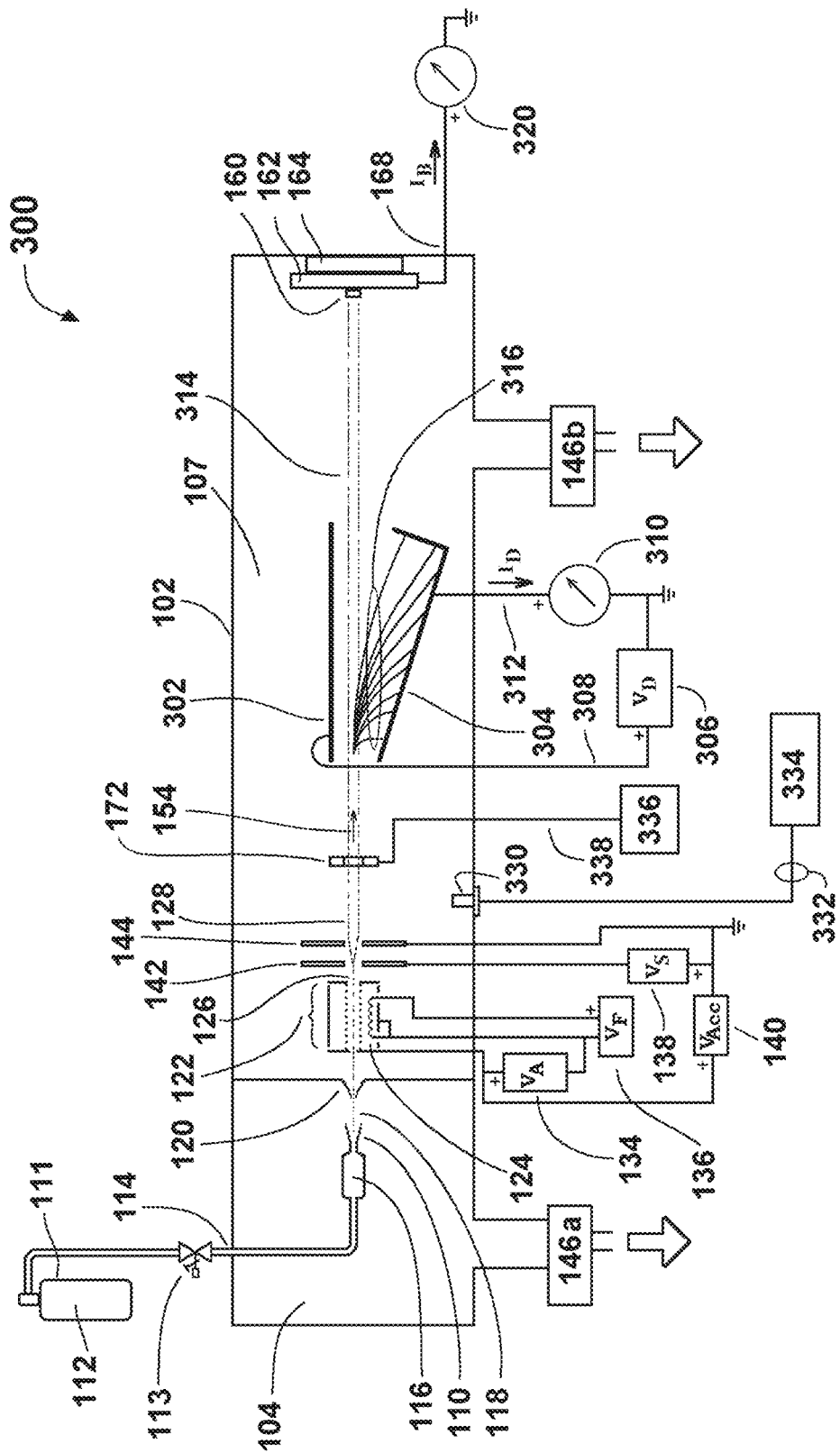
FIG. 3 is a schematic of an apparatus according to an embodiment of the invention, which uses electrostatic deflection plates to separate the charged and uncharged beam components.

FIG. 3 is a schematic of a Neutral Beam processing apparatus 300 according to an embodiment of the invention, which uses electrostatic deflection plates to separate the charged and uncharged portions of a GCIB. A beamline chamber 107 encloses the ionizer and accelerator regions and the workpiece processing regions. The beamline chamber 107 has high conductance and so the pressure is substantially uniform throughout. A vacuum pump 146b evacuates the beamline chamber 107. Gas flows into the beamline chamber 107 in the form of clustered and unclustered gas transported by the gas jet 118 and in the form of additional unclustered gas that leaks through the gas skimmer aperture 120. A pressure sensor 330 transmits pressure data from the beamline chamber 107 through an electrical cable 332 to a pressure sensor controller 334, which measures and displays pressure in the beamline chamber 107. The pressure in the beamline chamber 107 depends on the balance of gas flow into the beamline chamber 107 and the pumping speed of the vacuum pump 146b. By selection of the diameter of the gas skimmer aperture 120, the flow of source gas 112 through the nozzle 110, and the pumping speed of the vacuum pump 146b, the pressure in the beamline chamber 107 equilibrates at a pressure, $P_B$, determined by design and by nozzle flow. The GCIB flight path from grounded electrode 144 to workpiece holder 162, is for example, 100 cm. By design and adjustment $P_B$ may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per $cm^2$, which combined with monomer evolution due to the initial ionization of the gas clusters in the ionizer 122 and collisions that occur between gas cluster ions in the GCIB 128 is observed to be effective for dissociating the gas cluster ions in the GCIB 128 and results in a fully dissociated accelerated Neutral Beam 314. $V_{Acc}$ may be for example 30 kV and the GCIB 128 is accelerated by that potential. A pair of deflection plates (302 and 304) is disposed about the axis 154 of the GCIB 128. A deflector power supply 306 provides a positive deflection voltage $V_D$ to deflection plate 302 via electrical lead 308. Deflection plate 304 is connected to electrical ground by electrical lead 312 and through current sensor/display 310. Deflector power supply 306 is manually controllable. $V_D$ may be adjusted from zero to a voltage sufficient to completely deflect the ionized portion 316 of the GCIB 128 onto the deflection plate 304 (for example a few thousand volts). When the ionized portion 316 of the GCIB 128 is deflected onto the deflection plate 304, the resulting current, $I_D$ flows through electrical lead 312 and current sensor/display 310 for indication. When $V_D$ is zero, the GCIB 128 is undeflected and travels to the workpiece 160 and the workpiece holder 162. The GCIB beam current $I_B$ is collected on the workpiece 160 and the workpiece holder 162 and flows through electrical lead 168 and current sensor/display 320 to electrical ground. $I_B$ is indicated on the current sensor/display 320. A beam gate 172 is controlled through a linkage 338 by beam gate controller 336. Beam gate controller 336 may be manual or may be electrically or mechanically timed by a preset value to open the beam gate 172 for a predetermined interval. In use, $V_D$ is set to zero, and the beam current, $I_B$, striking the workpiece holder is measured. Based on previous experience for a given GCIB process recipe, an initial irradiation time for a given process is determined based on the measured current, $I_B$. $V_D$ is increased until all measured beam current is transferred from $I_B$ to $I_D$ and $I_D$ no longer increases with increasing $V_D$. At this point a Neutral Beam 314 comprising energetic dissociated components of the initial GCIB 128 irradiates the workpiece holder 162. The beam gate 172 is then closed and the workpiece 160 placed onto the workpiece holder 162 by conventional workpiece loading means (not shown). The beam gate 172 is opened for the predetermined initial radiation time. After the irradiation interval, the workpiece may be examined and the processing time adjusted as necessary to calibrate the desired duration of Neutral Beam processing based on the measured GCIB beam current $I_B$. Following such a calibration process, additional workpieces may be processed using the calibrated exposure duration.

The Neutral Beam 314 contains a repeatable fraction of the initial energy of the accelerated GCIB 128. The remaining ionized portion 316 of the original GCIB 128 has been removed from the Neutral Beam 314 and is collected by the grounded deflection plate 304. The ionized portion 316 that is removed from the Neutral Beam 314 may include monomer ions and gas cluster ions including intermediate size gas cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. The separated charged beam components largely consist of cluster ions of intermediate size as well as monomer ions and perhaps some large cluster ions. As will be shown below, certain superior process results are obtained by processing workpieces using this Neutral Beam.

Figure 4:
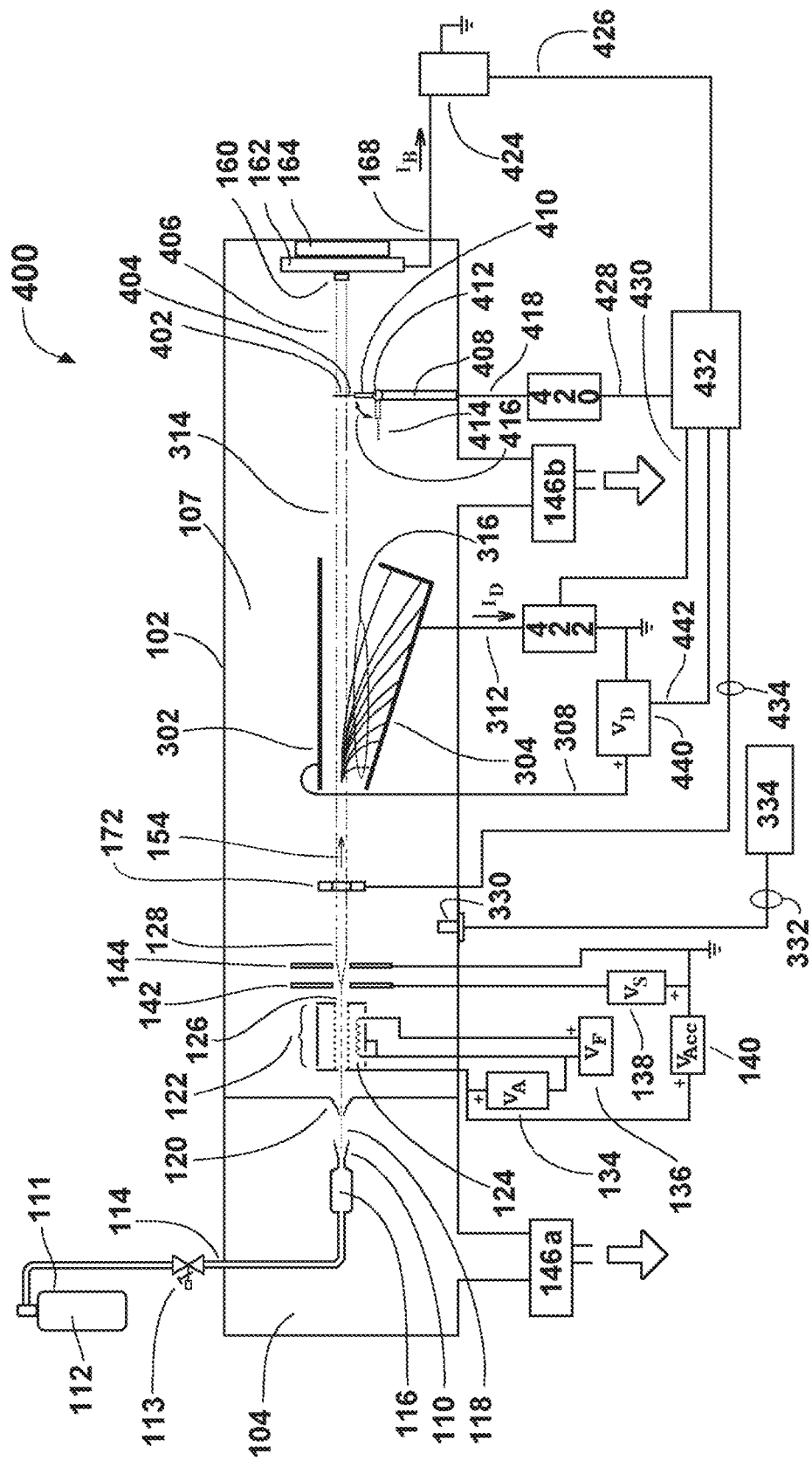
FIG. 4 is a schematic of an apparatus according to the an embodiment of the invention, using a thermal sensor for Neutral Beam measurement.

FIG. 4 is a schematic of a Neutral Beam processing apparatus 400 according to an embodiment of the invention, which uses a thermal sensor for Neutral Beam measurement. A thermal sensor 402 attaches via low thermal conductivity attachment 404 to a rotating support arm 410 attached to a pivot 412. Actuator 408 moves thermal sensor 402 via a reversible rotary motion 416 between positions that intercept the Neutral Beam 314 or GCIB 128 and a parked position indicated by 414 where the thermal sensor 402 does not intercept any beam. When thermal sensor 402 is in the parked position (indicated by 414) the GCIB 128 or Neutral Beam 314 continues along path 406 for irradiation of the workpiece 160 and/or workpiece holder 162. A thermal sensor controller 420 controls positioning of the thermal sensor 402 and performs processing of the signal generated by thermal sensor 402. Thermal sensor 402 communicates with the thermal sensor controller 420 through an electrical cable 418. Thermal sensor controller 420 communicates with a dosimetry controller 432 through an electrical cable 428. A beam current measurement device 424 measures beam current $I_B$ flowing in electrical lead 168 when the GCIB 128 strikes the workpiece 160 and/or the workpiece holder 162. Beam current measurement device 424 communicates a beam current measurement signal to dosimetry controller 432 via electrical cable 426. Dosimetry controller 432 controls setting of open and closed states for beam gate 172 by control signals transmitted via linkage 434. Dosimetry controller 432 controls deflector power supply 440 via electrical cable 442 and can control the deflection voltage $V_D$ between voltages of zero and a positive voltage adequate to completely deflect the ionized portion 316 of the GCIB 128 to the deflection plate 304. When the ionized portion 316 of the GCIB 128 strikes deflection plate 304, the resulting current $I_D$ is measured by current sensor 422 and communicated to the dosimetry controller 432 via electrical cable 430. In operation dosimetry controller 432 sets the thermal sensor 402 to the parked position 414, opens beam gate 172, sets $V_D$ to zero so that the full GCIB 128 strikes the workpiece holder 162 and/or workpiece 160. The dosimetry controller 432 records the beam current $I_B$ transmitted from beam current measurement device 424. The dosimetry controller 432 then moves the thermal sensor 402 from the parked position 414 to intercept the GCIB 128 by commands relayed through thermal sensor controller 420. Thermal sensor controller 420 measures the beam energy flux of GCIB 128 by calculation based on the heat capacity of the sensor and measured rate of temperature rise of the thermal sensor 402 as its temperature rises through a predetermined measurement temperature (for example 70 degrees C.) and communicates the calculated beam energy flux to the dosimetry controller 432 which then calculates a calibration of the beam energy flux as measured by the thermal sensor 402 and the corresponding beam current measured by the beam current measurement device 424. The dosimetry controller 432 then parks the thermal sensor 402 at parked position 414, allowing it to cool and commands application of positive $V_D$ to deflection plate 302 until all of the current $I_D$ due to the ionized portion of the GCIB 128 is transferred to the deflection plate 304. The current sensor 422 measures the corresponding $I_D$ and communicates it to the dosimetry controller 432. The dosimetry controller also moves the thermal sensor 402 from parked position 414 to intercept the Neutral Beam 314 by commands relayed through thermal sensor controller 420. Thermal sensor controller 420 measures the beam energy flux of the Neutral Beam 314 using the previously determined calibration factor and the rate of temperature rise of the thermal sensor 402 as its temperature rises through the predetermined measurement temperature and communicates the Neutral Beam energy flux to the dosimetry controller 432. The dosimetry controller 432 calculates a neutral beam fraction, which is the ratio of the thermal measurement of the Neutral Beam 314 energy flux to the thermal measurement of the full GOB 128 energy flux at sensor 402. Under typical operation, a neutral beam fraction of about 5% to about 95% is achieved. Before beginning processing, the dosimetry controller 432 also measures the current, $I_D$, and determines a current ratio between the initial values of $I_B$ and $I_D$. During processing, the instantaneous $I_D$ measurement multiplied by the initial $I_B/I_D$ ratio may be used as a proxy for continuous measurement of the $I_B$ and employed for dosimetry during control of processing by the dosimetry controller 432. Thus the dosimetry controller 432 can compensate any beam fluctuation during workpiece processing, just as if an actual beam current measurement for the full GCIB 128 were available. The dosimetry controller uses the neutral beam fraction to compute a desired processing time for a particular beam process. During the process, the processing time can be adjusted based on the calibrated measurement of $I_D$ for correction of any beam fluctuation during the process.

Figure 5:
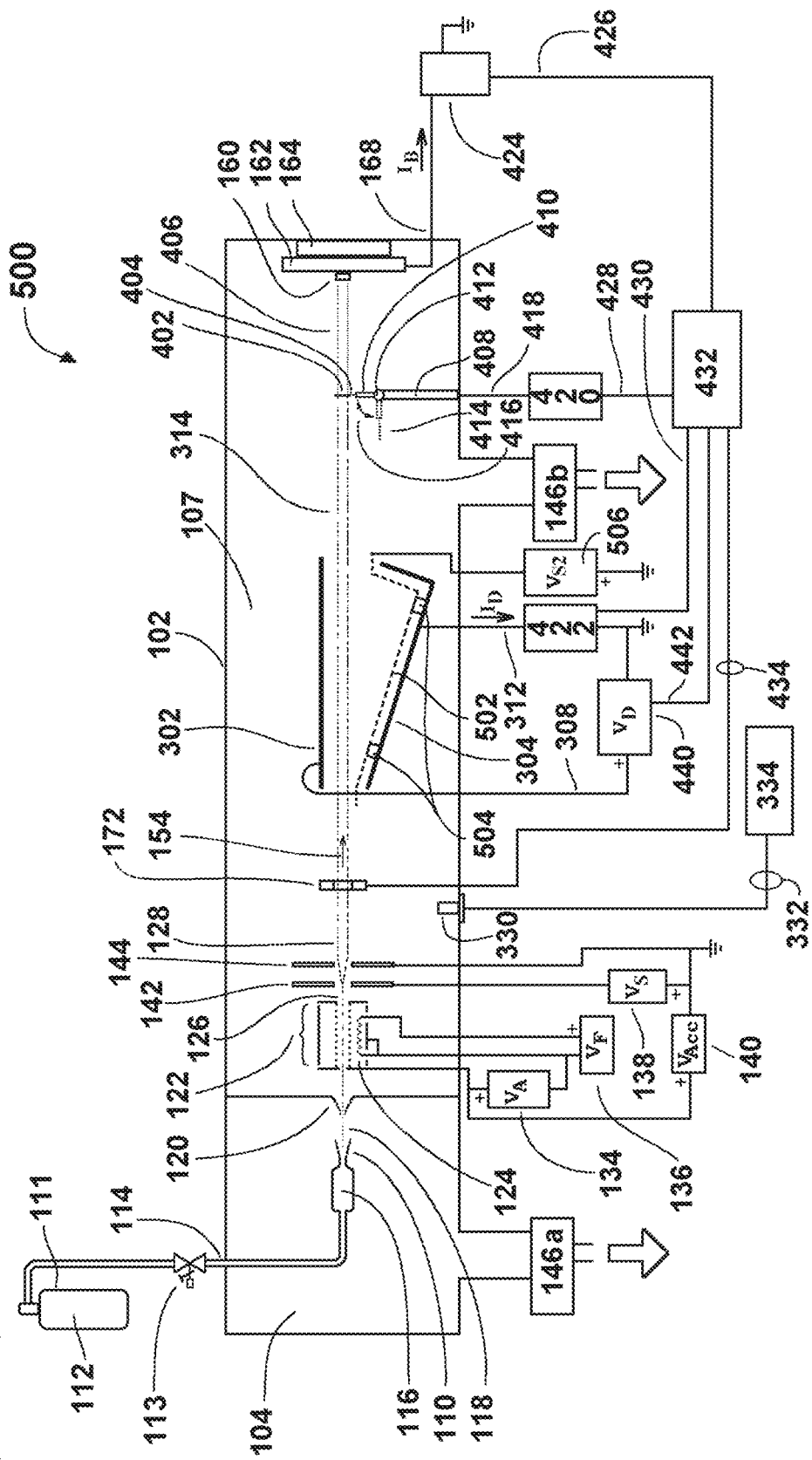
FIG. 5 is a schematic of an apparatus according to an embodiment of the invention which uses deflected ion beam current collected on a suppressed deflection plate as a component of a dosimetry scheme.

FIG. 5 is a schematic of a Neutral Beam processing apparatus 500 according to an embodiment of the invention that uses deflected ion beam current collected on a suppressed deflection plate as a component of a dosimetry scheme. Referring briefly to FIG. 4, the dosimetry scheme shown in FIG. 4 can suffer from the fact that the current, $I_D$, includes the current due to the ionized portion 316 of the GCIB 128 as well as secondary electron currents resulting from ejection of secondary electrons emitted when the ionized portion 316 of the beam strikes deflection plate 304. The secondary electron yield can vary depending on the distribution of cluster ion sizes in the ionized portion 316. It can also vary depending on the surface state (cleanliness, etc.) of the impacted surface of the deflection plate 304. Thus, in the scheme described in FIG. 4, the magnitude of $I_D$ is not a precise representation of the current due to the ionized portion 316 of the GCIB 128. Referring again now to FIG. 5, an improved measurement of the ionized portion 316 of GCIB 128 can be realized at deflection plate 304 by adding an electron suppressor grid electrode 502 proximal to the surface of deflection plate 304 that receives the ionized portion 316. The electron suppressor grid electrode 502 is highly transparent to the ionized portion 316, but is biased negative with respect to the deflection plate 304 by second suppressor voltage $V_{S2}$ provided by second suppressor power supply 506. Effective suppression of secondary electrons is typically achieved by a $V_{S2}$ on the order of several tens of volts. By suppressing the emission of secondary electrons, the current loading of deflector power supply 440 is reduced and the precision of the $I_D$ representation of the current in the ionized portion 316 of the GCIB 128 is increased. Electron suppressor grid 502 is insulated from and maintained in proximity to deflection plate 304 by insulating supports 504.

Figure 6:
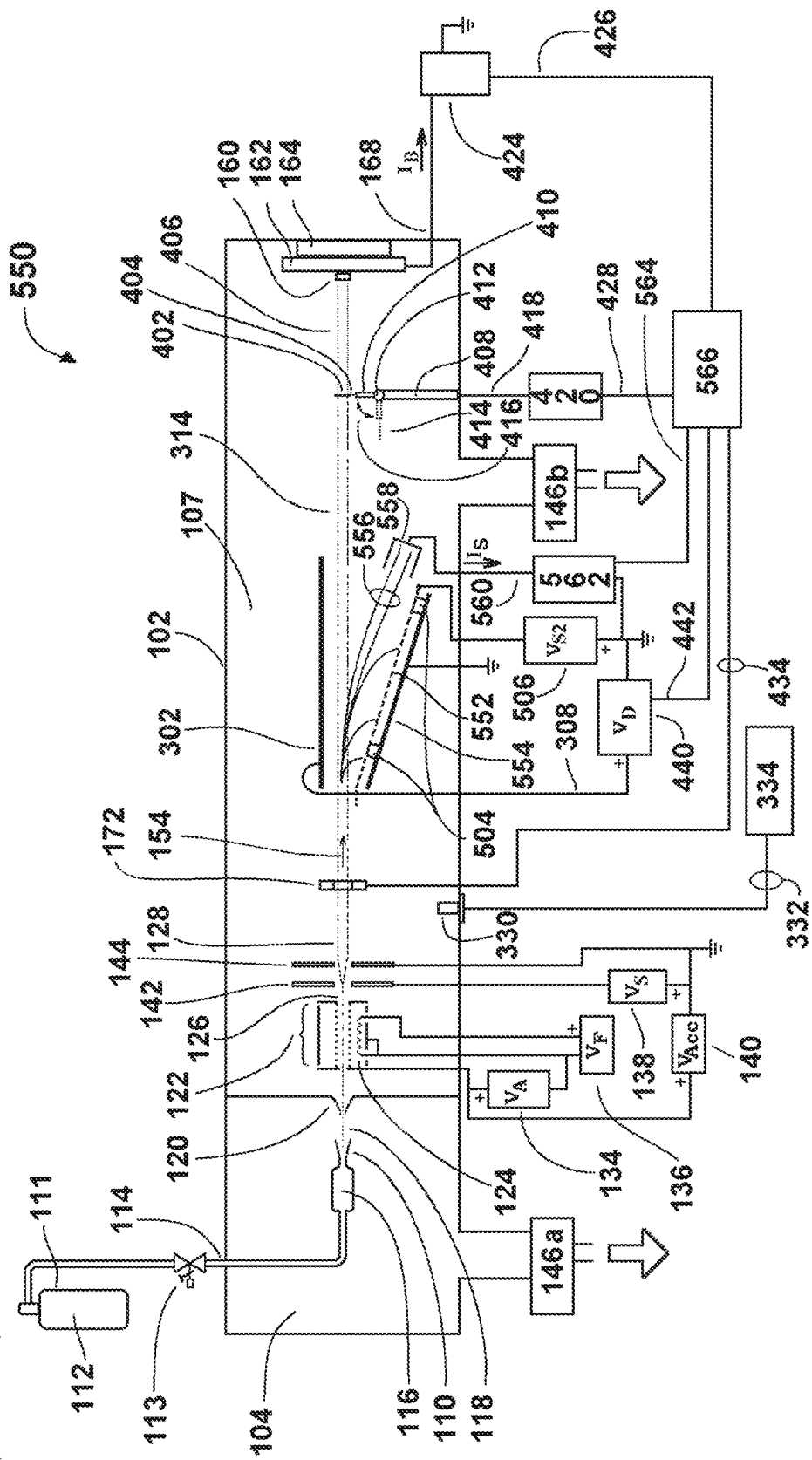
FIG. 6 is a schematic of an apparatus according to an embodiment of the invention which uses a sample of the deflected ion beam collected in a faraday cup as a component of a dosimetry scheme.

FIG. 6 is a schematic of a Neutral Beam processing apparatus 550 according to an embodiment of the invention that uses a sample of deflected ion beam current collected in a faraday cup as a component of a dosimetry scheme. In this embodiment of the invention, a sample 556 of the ionized portion 316 (as shown in FIG. 5) is captured in a faraday cup 558. Sample current, $I_S$, collected in the faraday cup 558 is conducted via electrical lead 560 to current sensor 562 for measurement, and the measurement is communicated to a dosimetry controller 566 via electrical cable 564. Faraday cup 558 provides a superior current measurement to that obtained by measuring the current $I_D$ collected by deflection plate 304 (as shown in FIG. 5). Current sensor 562 operates substantially as previously described for the current sensor 422 (as shown in FIG. 5) except that current sensor 562 has increased sensitivity to accommodate the smaller magnitude of $I_S$ as compared to $I_D$. Dosimetry controller 566 operates substantially as previously described for dosimetry controller 432 (as shown in FIG. 5) except that it is designed to accommodate a smaller current measurement $I_S$ (as compared to $I_D$ of FIG. 5).

Figure 7:
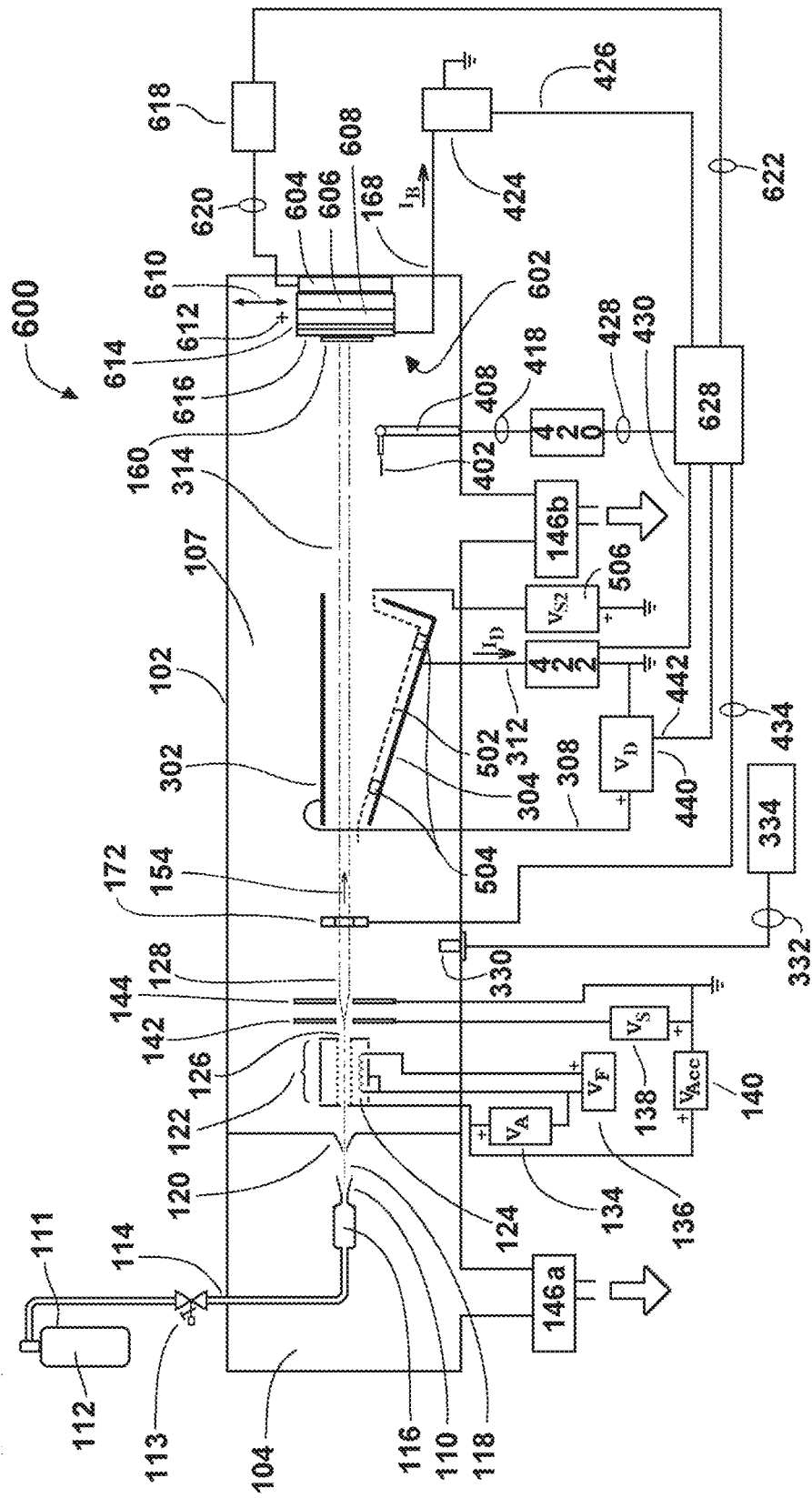
FIG. 7 shows a schematic of an apparatus according to an embodiment of the invention, employing mechanical scanning for irradiating an extended workpiece uniformly with a Neutral Beam.

FIG. 7 is a schematic of a Neutral Beam processing apparatus 600 according to an embodiment of the invention that uses mechanical scanner 602 to scan a spatially extended workpiece 160 through the Neutral Beam 314 to facilitate uniform Neutral Beam scanning of a large workpiece. Since the Neutral Beam 314 cannot be scanned by magnetic or electrostatic techniques, when the workpiece 160 to be processed is spatially larger than the extent of the Neutral Beam 314 and uniform processing of the workpiece 160 is required, a mechanical scanner 602 is employed to scan the workpiece 160 through the Neutral Beam 314. Mechanical scanner 602 has a workpiece holder 616 for holding workpiece 160. The mechanical scanner 602 is disposed so that either the Neutral Beam 314 or the GCIB 128 can be incident on the workpiece 160 and/or the workpiece holder 616. When the deflection plates (302, 304) deflect the ionized portion 316 out of the GCIB 128, the workpiece 160 and/or the workpiece holder 616 receive only the Neutral Beam 314. When the deflection plates (302, 304) do not deflect the ionized portion 316 of the GCIB 128, the workpiece 160 and/or the workpiece holder 616 receives the full GCIB 128. Workpiece holder 616 is electrically conductive and is insulated from ground by insulator 614. Beam current ($I_B$) due to GCIB 128 incident on the workpiece 160 and/or the workpiece holder 616 is conducted to beam current measurement device 424 via electrical lead 168. Beam current measurement device 424 measures $I_B$ and communicates the measurement to dosimetry controller 628. Mechanical scanner 602 has an actuator base 604 containing actuators controlled by mechanical scan controller 618 via electrical cable 620. Mechanical scanner 602 has a Y-displacement table 606 capable of reversible motion in an Y-direction 610, and it has an X-displacement table 608 capable of reversible motion in an X-direction 612, indicated as in and out of the plane of the paper of FIG. 7. Movements of the Y-displacement table 606 and of the X-displacement table 608 are actuated by actuators in the actuator base 604 under control of the mechanical scan controller 618. Mechanical scan controller 618 communicates via electrical cable 622 with dosimetry controller 628. Function of dosimetry controller 628 includes all functions previously described for dosimetry controller 432, with additional function for controlling the mechanical scanner 602 via communication with mechanical scan controller 618. Based on measured Neutral Beam energy flux rate, dosimetry controller 628 calculates and communicates to mechanical scan controller 618 the Y- and X-scanning rates for causing an integral number of complete scans of the workpiece 160 to be completed during processing of a workpiece 160, insuring complete and uniform processing of the workpiece and insures a predetermined energy flux dose to the workpiece 160. Except for the use of a Neutral Beam, and the use of a Neutral Beam energy flux rate measurement, such scanning control algorithms are conventional and commonly employed in, for examples, conventional GCIB processing tools and in ion implantation tools. It is noted that the Neutral Beam processing apparatus 600 can be used as a conventional GCIB processing tool by controlling the deflection plates (302, 304) so that GCIB 128 passes without deflection, allowing the full GCIB 128 to irradiate the workpiece 160 and/or the workpiece holder 616.

Figure 8:
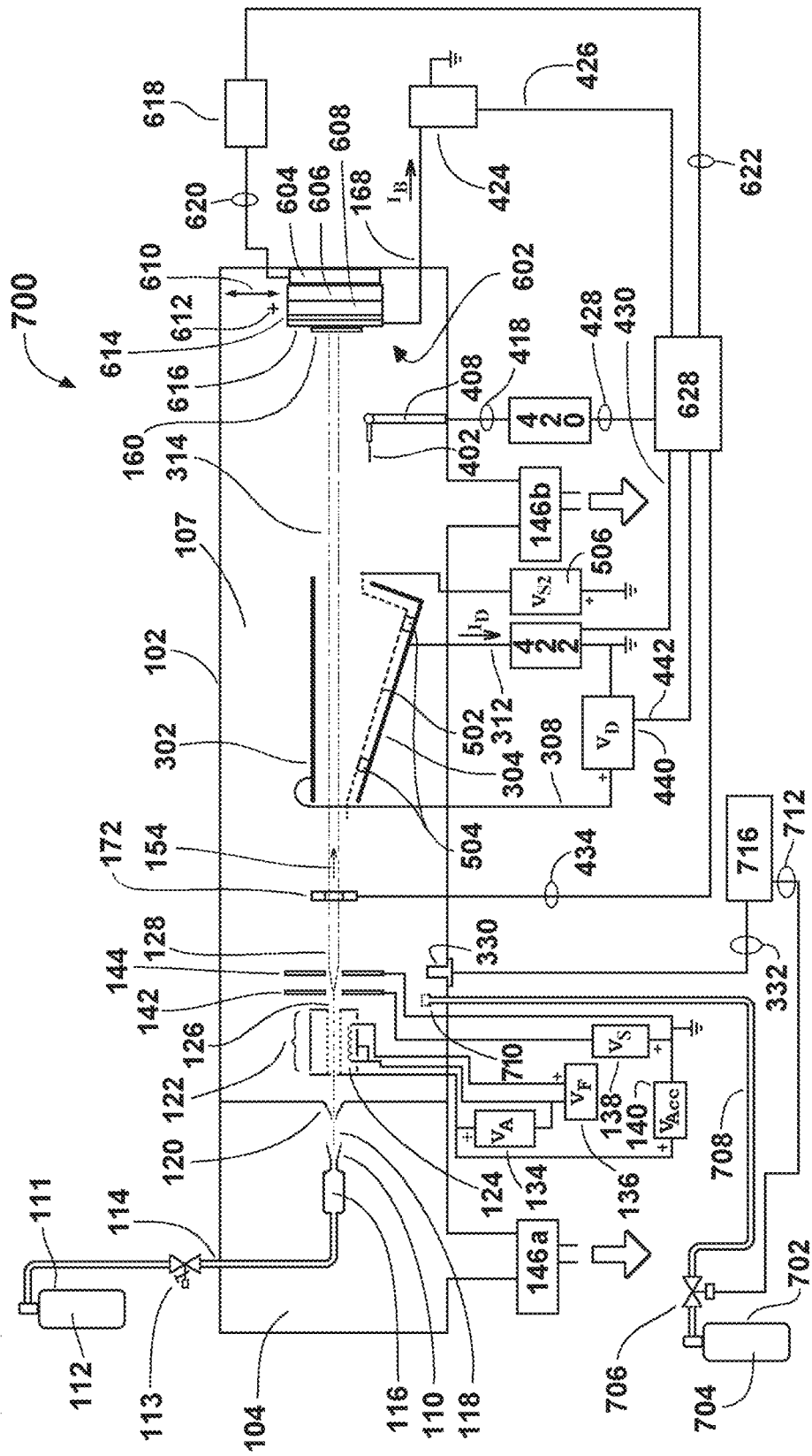
FIG. 8 shows a schematic of an apparatus according to an embodiment of the invention with means for controlling the gas target thickness by injecting gas into the beamline chamber.

FIG. 8 is a schematic of a Neutral Beam processing apparatus 700 according to an embodiment of the invention that provides active setting and control of the gas pressure in the beamline chamber 107. A pressure sensor 330 transmits pressure measurement data from the beamline chamber 107 through an electrical cable 332 to a pressure controller 716, which measures and displays pressure in the beamline chamber. The pressure in the beamline chamber 107 depends on the balance of gas flow into the beamline chamber 107 and the pumping speed of the vacuum pump 146b. A gas bottle 702 contains a beamline gas 704 that is preferably the same gas species as the source gas 112. Gas bottle 702 has a remotely operable leak valve 706 and a gas feed tube 708 for leaking beamline gas 704 into the beamline chamber 107 through a gas diffuser 710 in the beamline chamber 107. The pressure controller 716 is capable of receiving an input set point (by manual entry or by automatic entry from an system controller (not shown)) in the form of a pressure set point, a pressure times beam path length set point (based on predetermined beam path length), or a gas target thickness set point. Once a set point has been established for the pressure controller 716, it regulates the flow of beamline gas 704 into the beamline chamber 107 to maintain the set point during operation of the Neutral Beam processing apparatus. When such a beamline pressure regulation system is employed, the vacuum pump 146b is normally sized so that in the absence of beamline gas 704 being introduced into the beamline chamber 107, the baseline pressure in the beamline chamber 107 is lower than the desired operating pressure. If the baseline pressure is chosen so that the conventional GCIB 128 can propagate the length of the beam path without excessive dissociation, then the Neutral Beam processing apparatus 700 can also be used as a conventional GCIB processing tool.

Figure 9:
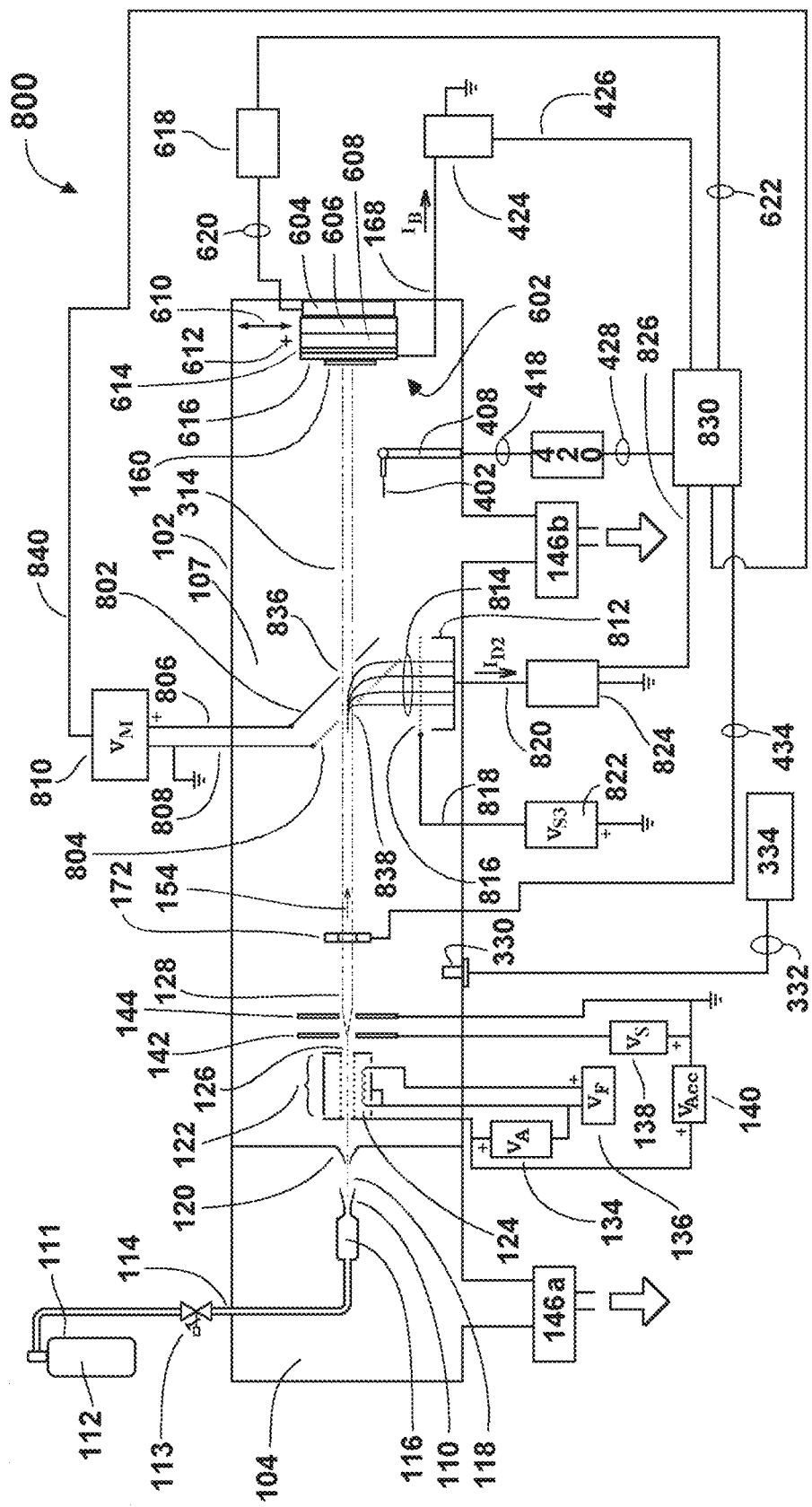
FIG. 9 shows a schematic of an apparatus according to an embodiment of the invention, which uses an electrostatic mirror to separate charged and neutral beam components.

FIG. 9 is a schematic of a Neutral Beam processing apparatus 800 according to an embodiment of the invention that employs an electrostatic mirror for separation of the charged and neutral beam portions. A reflecting electrode 802 and a substantially transparent electrical grid electrode 804 are disposed displaced from each other, parallel to each other, and at a 45-degree angle to the beam axis 154. The reflecting electrode 802 and the substantially transparent electrical grid electrode 804 both have holes (836 and 838 respectively) centered on the beam axis 154 for permitting passage of the Neutral Beam 314 through the two electrodes. A mirror power supply 810 provides a mirror electrical potential $V_M$ across the gap between the reflecting electrode 802 and the substantially transparent electrical grid electrode 804 via electrical leads 806 and 808, with polarity as indicated in FIG. 9. $V_M$ is selected to be slightly greater than $V_{Acc}+V_R$ ($V_R$ being the retarding potential required to overcome the thermal energy the gas cluster jet has before ionization and acceleration—$V_R$ is typically on the order of a few kV). The electric field generated between the reflecting electrode 802 and the substantially transparent electrical grid electrode 804 deflects the ionized portion 814 of the GCIB 128 through approximately a 90-degree angle with respect to the axis 154. A faraday cup 812 is disposed to collect the ionized portion 814 of the GCIB 128. A suppressor electrode grid electrode 816 prevents escape of secondary electrons from the faraday cup 812. The suppressor grid electrode 816 is biased with a negative third suppressor voltage $V_{S3}$ provided by third suppressor power supply 822. $V_{S3}$ is typically on the order of several tens of volts. The faraday cup current, $I_{D2}$, representing current in the deflected ionized portion 814 of the GCIB 128 (and thus the current in the GCIB 128) flows through electrical lead 820 to current sensor 824. Current sensor 824 measures the current $I_{D2}$ and transmits the measurement to dosimetry controller 830 via electrical lead 826. The function of dosimetry controller 830 is as previously described for dosimetry controller 432, except that dosimetry controller 830 receives $I_{D2}$ current measurement information from current sensor 824 and dosimetry controller 830 does not control deflector power supply 440, but instead controls mirror power supply 810 via electrical cable 840. By setting mirror power supply 810 to output either zero volts or $V_M$, dosimetry controller 830 controls whether the full GCIB 128, or only the Neutral Beam 314 of GCIB 128 is transmitted to the workpiece 160 and/or workpiece holder 616 for measurement and/or processing.

Figure 10:
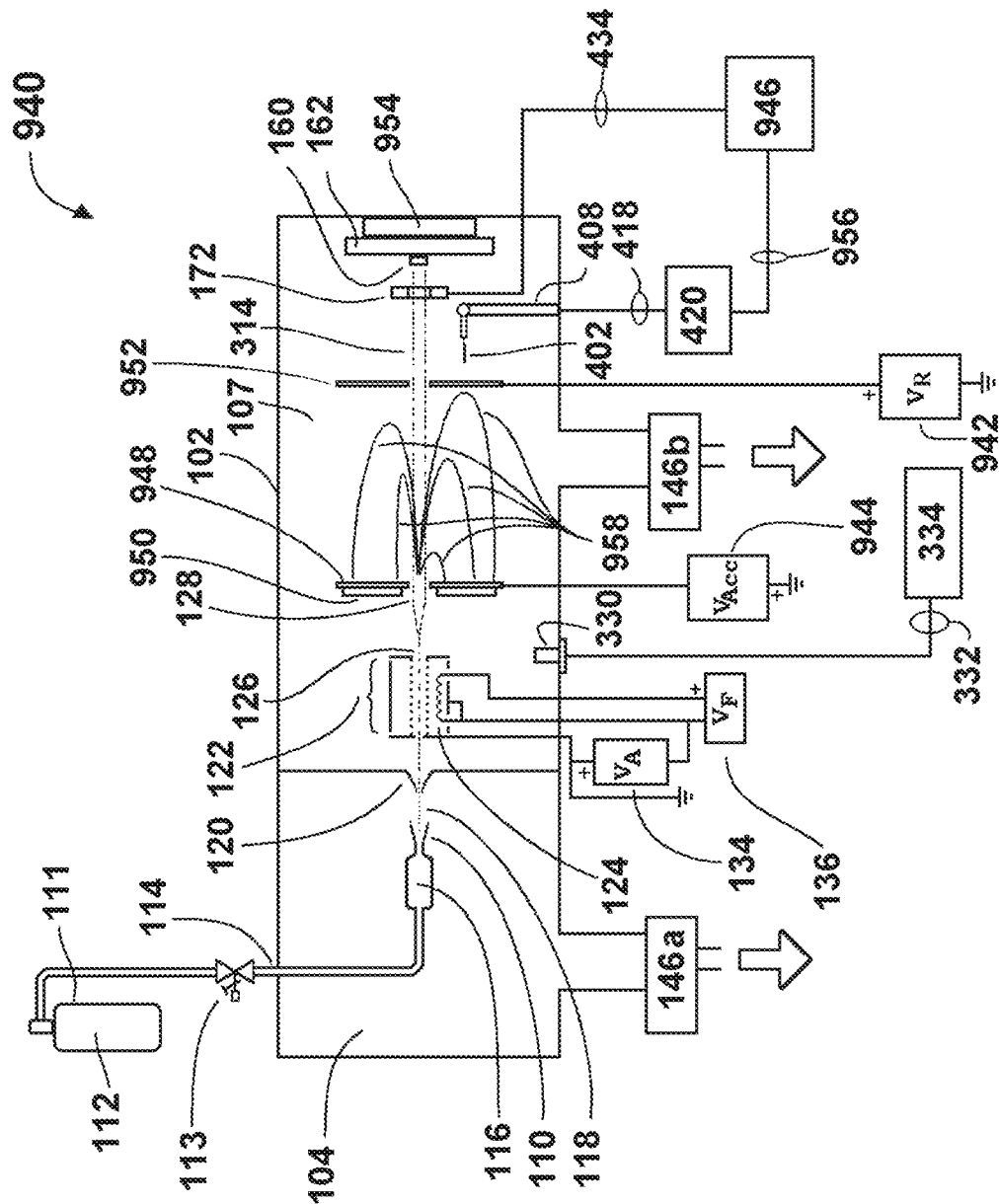
FIG. 10 shows a schematic of an apparatus according to an embodiment of the invention wherein an accelerate-decelerate configuration is used to separate the charged beam from the neutral beam components.

FIG. 10 is a schematic of a Neutral Beam processing apparatus 940 according to an embodiment of the invention, which has the advantage of both the ionizer 122 and the workpiece 160 operating at ground potential. The workpiece 160 is held in the path of Neutral Beam 314 by electrically conductive workpiece holder 162, which in turn is supported by electrically conductive support member 954 attached to a wall of the low-pressure vessel 102. Accordingly, workpiece holder 162 and the workpiece 160 are electrically grounded. An acceleration electrode 948 extracts gas cluster ions from ionizer exit aperture 126 and accelerates the gas cluster ions through a voltage potential $V_{Acc}$ provided by acceleration power supply 944 to form a GCIB 128. The body of ionizer 122 is grounded and $V_{Acc}$ is of negative polarity. Neutral gas atoms in the gas jet 118 have a small energy on the order of several tens of milli-electron-volts. As they condense into clusters, this energy accumulates proportional to cluster size, N. Sufficiently large clusters gain non-negligible energies from the condensation process and when accelerated through a voltage potential of $V_{Acc}$, the final energy of each ion exceeds $V_{Acc}$ by its neutral cluster jet energy. Downstream of the acceleration electrode 948, a retarding electrode 952 is employed to ensure deceleration of the ionized portion 958 of the GCIB 128. Retarding electrode 952 is biased at a positive retarding voltage, $V_R$, by retarding voltage power supply 942. A retarding voltage $V_R$ of a few kV is generally adequate to ensure that all ions in the GCIB 128 are decelerated and returned to the acceleration electrode 948. Permanent magnet arrays 950 are attached to the acceleration electrode 948 to provide magnetic suppression of secondary electrons that would otherwise be emitted as a result of the returned ions striking the acceleration electrode 948. A beam gate 172 is a mechanical beam gate and is located upstream of the workpiece 160. A dosimetry controller 946 controls the process dose received by the workpiece. A thermal sensor 402 is placed into a position that intercepts the Neutral Beam 314 for Neutral Beam energy flux measurement or in the parked position for Neutral Beam processing of the workpiece under control of the thermal sensor controller 420. When thermal sensor 402 is in the beam sensing position, the Neutral Beam energy flux is measured and transmitted to the dosimetry controller 946 over electrical cable 956. In normal use, the dosimetry controller 946 closes the beam gate 172 and commands the thermal sensor controller 420 to measure and report the energy flux of the Neutral Beam 314. Next, a conventional workpiece loading mechanism (not shown) places a new workpiece on the workpiece holder. Based on the measured Neutral Beam energy flux, the dosimetry controller 946 calculates an irradiation time for providing a predetermined desired Neutral Beam energy dose. The dosimetry controller 946 commands the thermal sensor 402 out of the Neutral Beam 314 and opens the beam gate 172 for the calculated irradiation time and then closes the beam gate 172 at the end of the calculated irradiation time to terminate the processing of the workpiece 160.

Figure 11:
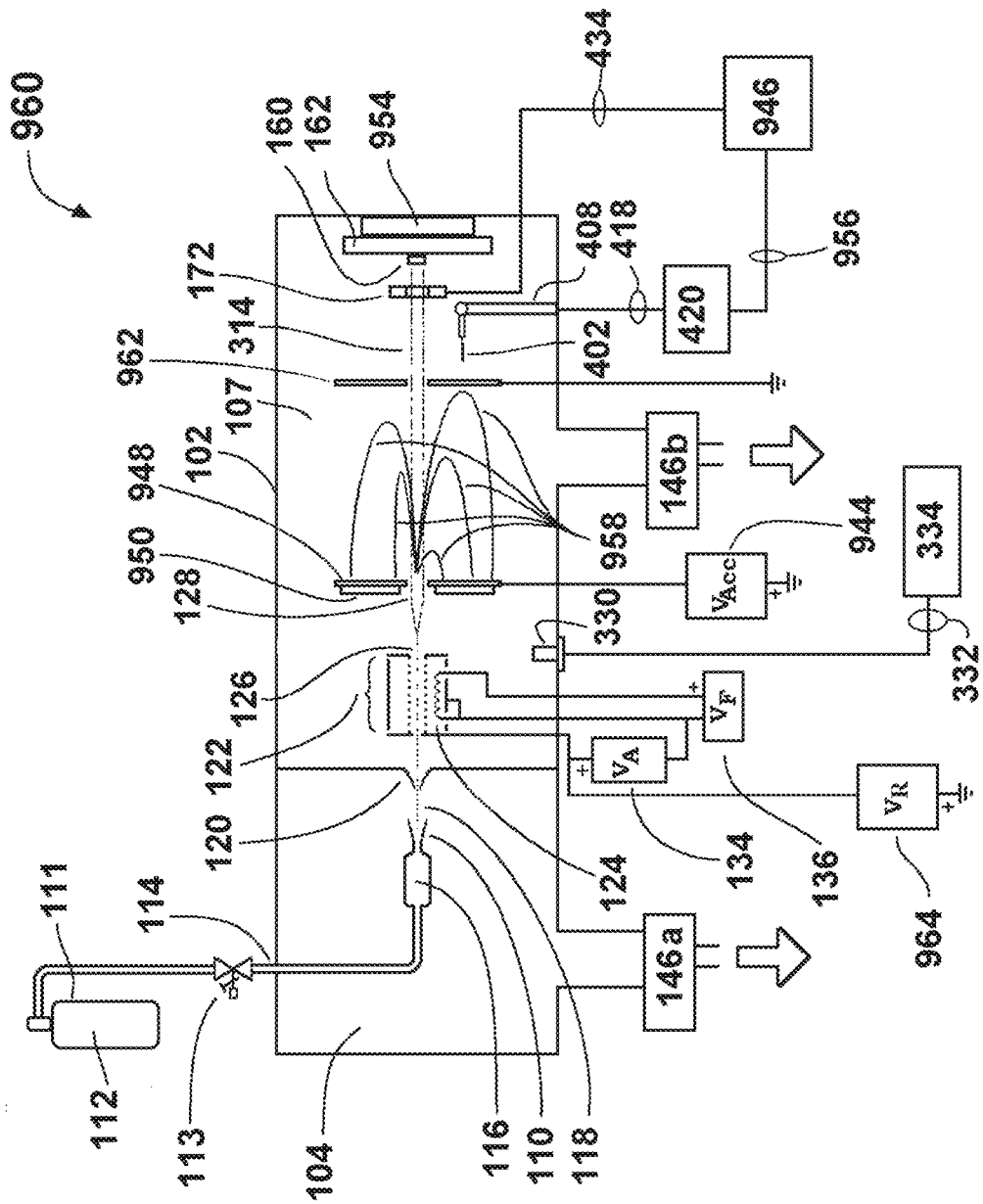
FIG. 11 shows a schematic of an apparatus according to an embodiment of the invention wherein an alternate accelerate-decelerate configuration is used to separate the charged beam from the neutral beam components.

FIG. 11 is a schematic of a Neutral Beam processing apparatus 960 according to an embodiment of the invention, wherein the ionizer 122 operates at a negative potential $V_R$ and wherein the workpiece operates at ground potential. An acceleration electrode 948 extracts gas cluster ions from ionizer exit aperture 126 and accelerates the gas cluster ions toward a potential of $V_{Acc}$ provided by acceleration power supply 944 to form a GCIB 128. The resulting GCIB 128 is accelerated by a potential $V_{Acc}-V_R$. A ground electrode 962 decelerates the ionized portion 958 of the GCIB 128 and returns it to the acceleration electrode 948.

Figure 14:
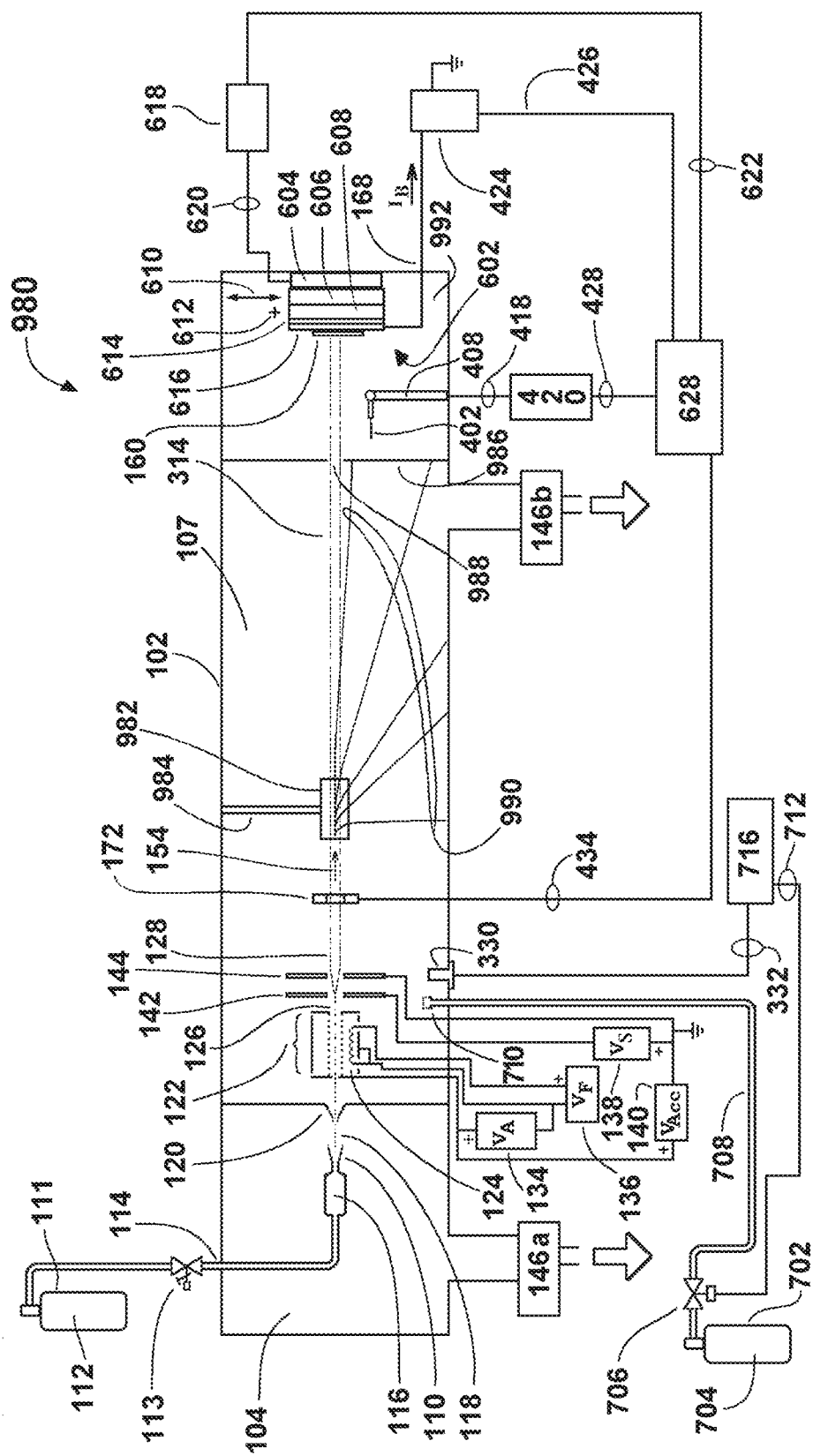
FIG. 14 is a schematic of a Neutral Beam processing apparatus according to an embodiment of the invention wherein magnetic separation is employed.

FIG. 14 is a schematic of a Neutral Beam processing apparatus 980 according to an embodiment of the invention. This embodiment is similar to that shown in FIG. 8, except that the separation of the charged beam components from the neutral beam components is done by means of a magnetic field, rather than an electrostatic field. Referring again to FIG. 14, a magnetic analyzer 982 has magnetic pole faces separated by a gap in which a magnetic B-field is present. Support 984 disposes the magnetic analyzer 982 relative to the GCIB 128 such that the GCIB 128 enters the gap of the magnetic analyzer 982 such that the vector of the B-field is transverse to the axis 154 of the GCIB 128. The ionized portion 990 of the GCIB 128 is deflected by the magnetic analyzer 982. A baffle 986 with a Neutral Beam aperture 988 is disposed with respect to the axis 154 so that the Neutral Beam 314 can pass through the Neutral Beam aperture 988 to the workpiece 160. The ionized portion 990 of the GCIB 128 strikes the baffle 986 and/or the walls of the low-pressure vessel 102 where it dissociates to gas that is pumped away by the vacuum pump 146b.

FIGS. 12A through 12D show the comparative effects of full and charge separated beams on a gold thin film. In an experimental setup, a gold film deposited on a silicon substrate was processed by a full GCIB (charged and neutral components), a Neutral Beam (charged components deflected out of the beam), and a deflected beam comprising only charged components. All three conditions are derived from the same initial GCIB, a 30 kV accelerated Ar GCIB. Gas target thickness for the beam path after acceleration was approximately $2\times10^{14}$ argon gas atoms per $cm^2$. For each of the three beams, exposures were matched to the total energy carried by the full beam (charged plus neutral) at an ion dose of $2\times10^{15}$ gas cluster ions per $cm^2$. Energy flux rates of each beam were measured using a thermal sensor and process durations were adjusted to ensure that each sample received the same total thermal energy dose equivalent to that of the full (charged plus neutral) GCIB dose.

Figure 12A:
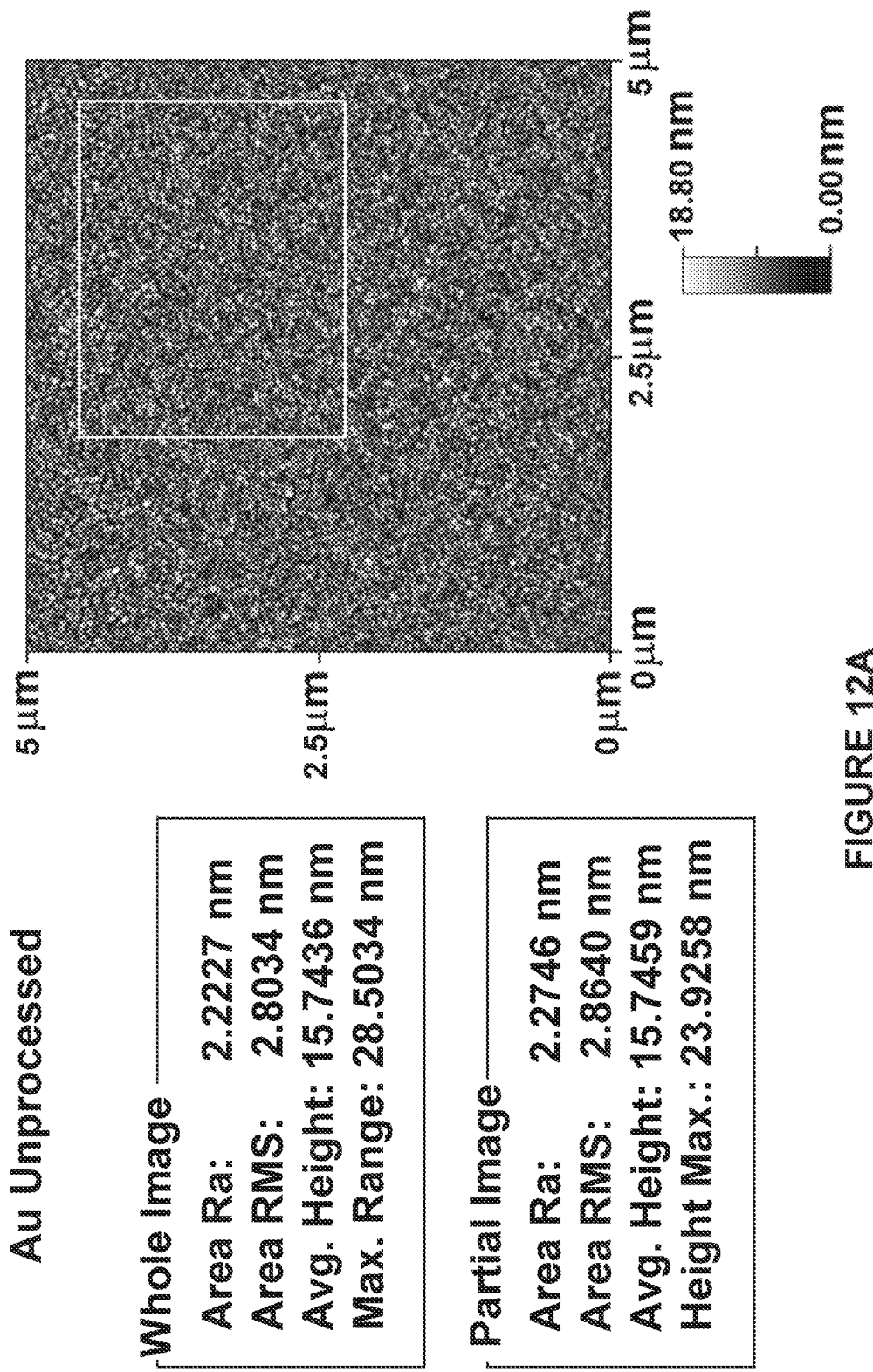
FIGS. 12A, 12B, 12C, and 12D show processing results indicating that for a metal film, processing by a neutral component of a beam produces superior smoothing of the film compared to processing with either a full GCIB or a charged component of the beam.
Figure 12B:
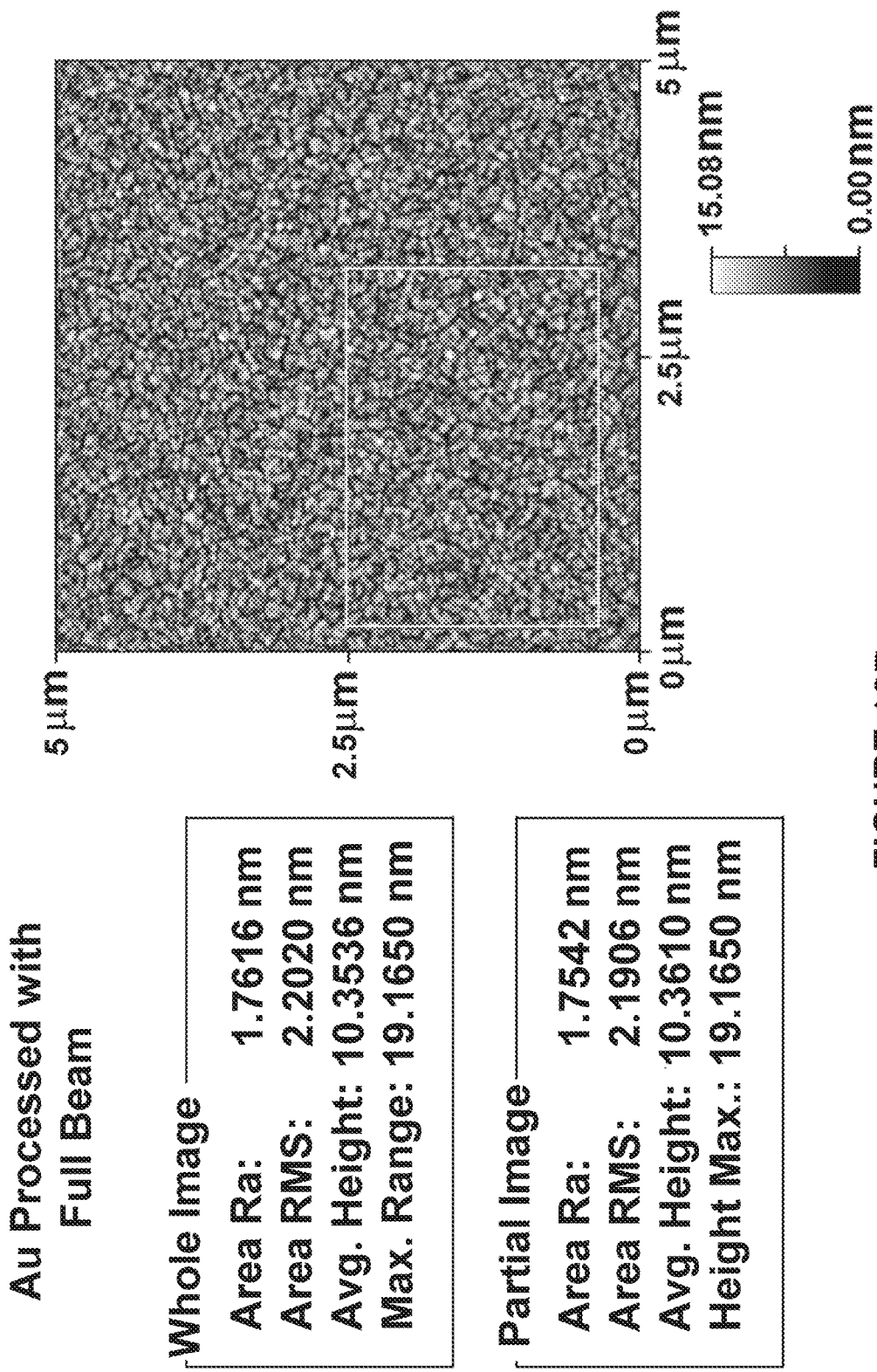
Figure 12C:
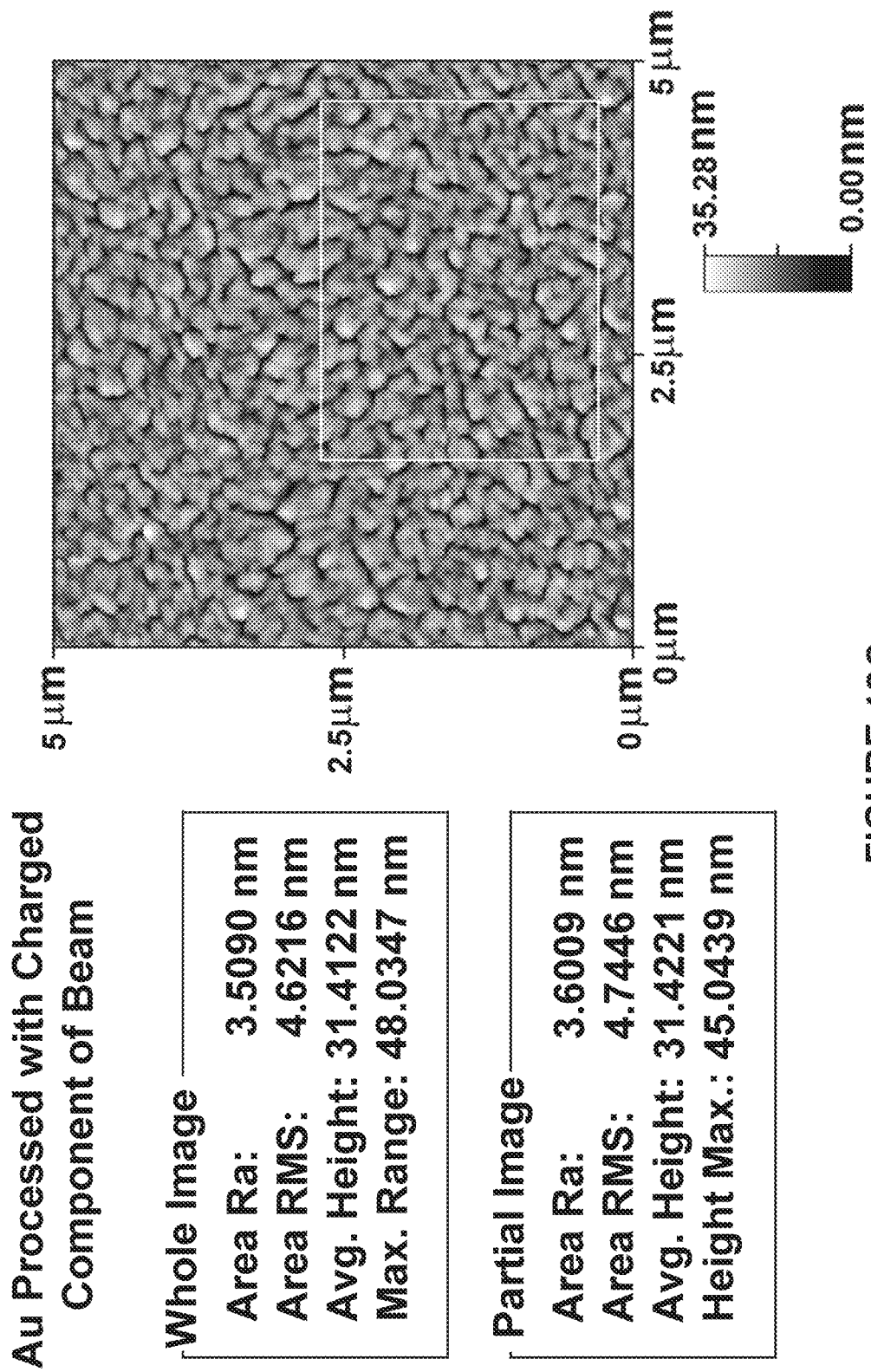
Figure 12D:
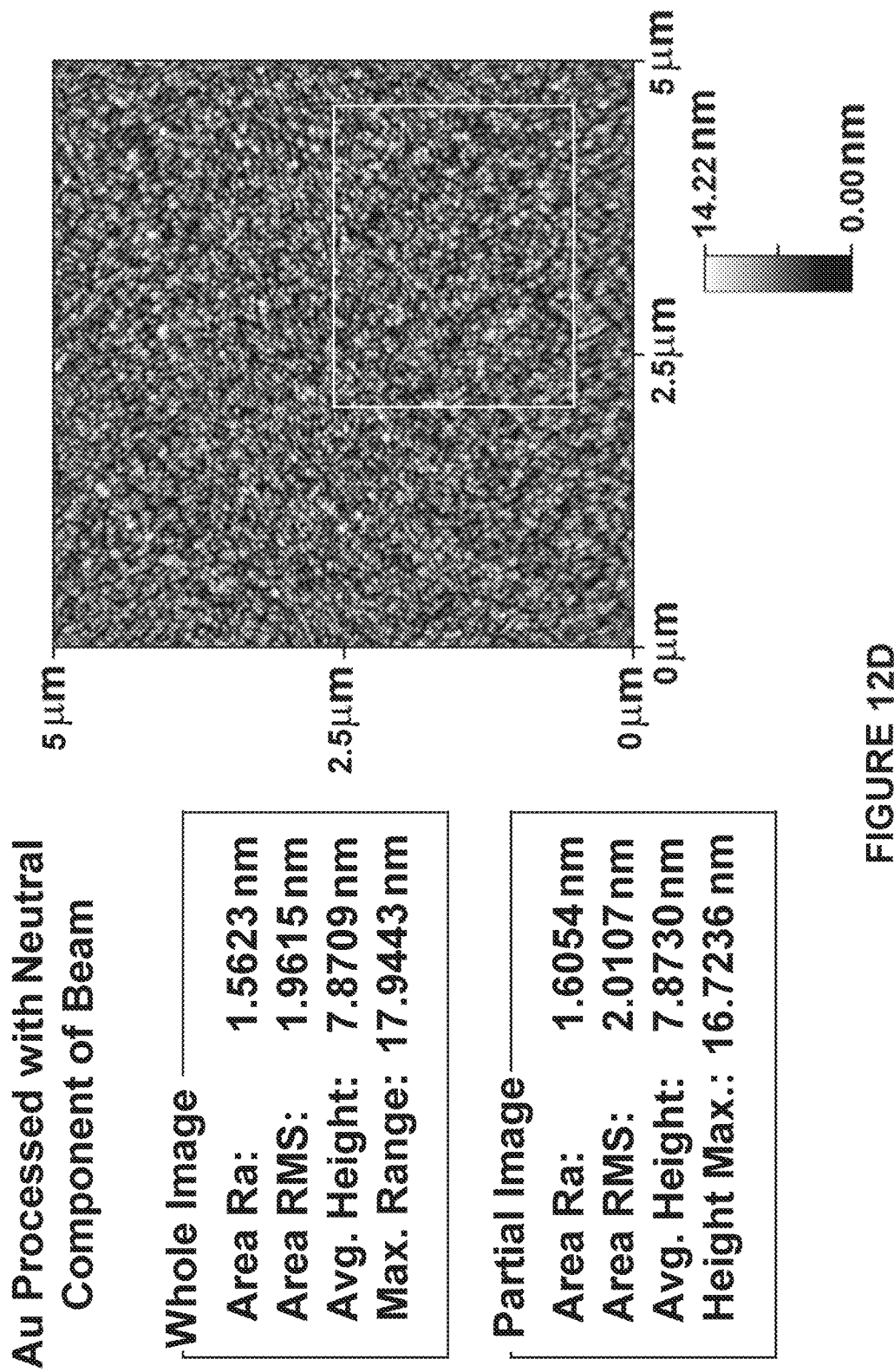

FIG. 12A shows an atomic force microscope (AFM) 5 micron by 5 micron scan and statistical analysis of an as-deposited gold film sample that had an average roughness, Ra, of approximately 2.22 nm. FIG. 12B shows an AFM scan of the gold surface processed with the full GCIB—average roughness, Ra, has been reduced to approximately 1.76 nm. FIG. 12C shows an AFM scan of the surface processed using only charged components of the beam (after deflection from the neutral beam components)—average roughness, Ra, has been increased to approximately 3.51 nm. FIG. 12D shows an AFM scan of the surface processed using only the neutral component of the beam (after charged components were deflected out of the Neutral Beam)—average roughness, Ra, is smoothed to approximately 1.56 nm. The full GCIB processed sample (B) is smoother than the as deposited film (A). The Neutral Beam processed sample (D) is smoother than the full GCIB processed sample (B). The sample (C) processed with the charged component of the beam is substantially rougher than the as-deposited film. The results support the conclusion that the neutral portions of the beam contribute to smoothing and the charged components of the beam contribute to roughening.

Figure 13A:
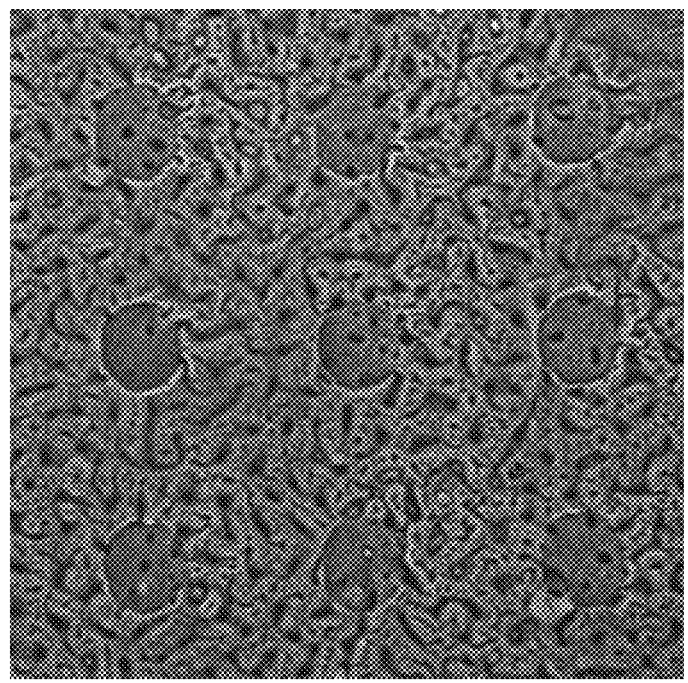
FIGS. 13A and 13B show comparison of a drug coating on a cobalt-chrome coupon representing a drug eluting medical device, wherein processing with a Neutral Beam produces a superior result to processing with a full GCIB.
Figure 13B:
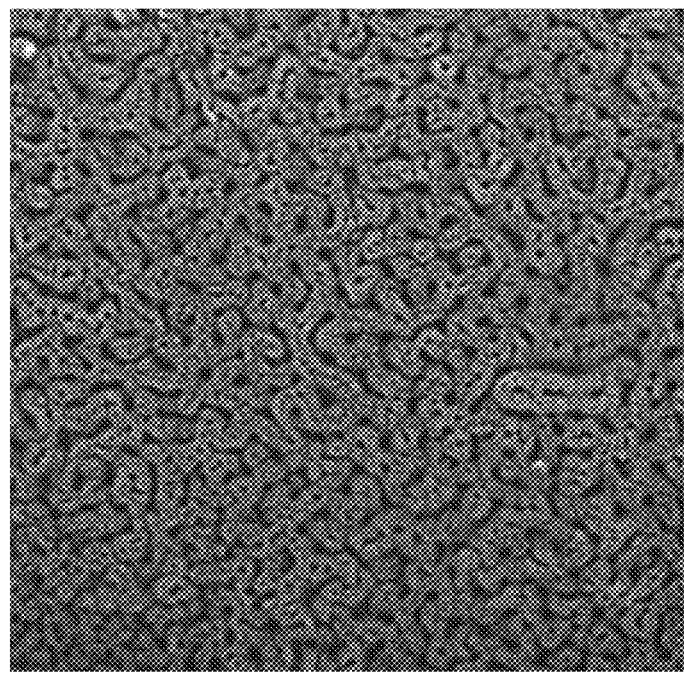

FIGS. 13A and 13B show comparative results of full GCIB and Neutral Beam processing of a drug film deposited on a cobalt-chrome coupon used to evaluate drug elution rate for a drug eluting coronary stent. FIG. 13A represents a sample irradiated using an argon GCIB (including the charged and neutral components) accelerated using $V_{Acc}$ of 30 kV with an irradiated dose of $2\times10^{15}$ gas cluster ions per $cm^2$. FIG. 13B represents a sample irradiated using a Neutral Beam derived from an argon GCIB accelerated using $V_{Acc}$ of 30 kV. The Neutral Beam was irradiated with a thermal energy dose equivalent to that of a 30 kV accelerated, $2\times10^{15}$ gas cluster ion per $cm^2$ dose (equivalent determined by beam thermal energy flux sensor). The irradiation for both samples was performed through a cobalt chrome proximity mask having an array of circular apertures of approximately 50 microns diameter for allowing beam transmission. FIG. 13A is a scanning electron micrograph of a 300 micron by 300 micron region of the sample that was irradiated through the mask with full beam. FIG. 13B is a scanning electron micrograph of a 300 micron by 300 micron region of the sample that was irradiated through the mask with a Neutral Beam. The sample shown in FIG. 13A exhibits damage and etching caused by the full beam where it passed through the mask. The sample shown in FIG. 13B exhibits no visible effect. In elution rate tests in physiological saline solution, the samples processed like the Figure B sample (but without mask) exhibited superior (delayed) elution rate compared to the samples processed like the FIG. 13A sample (but without mask). The results support the conclusion that processing with the Neutral Beam contributes to the desired delayed elution effect, while processing with the full GCIB (charged plus neutral components) contributes to weight loss of the drug by etching, with inferior (less delayed) elution rate effect.

To further illustrate the ability of an accelerated Neutral Beam derived from an accelerated GCIB to aid in attachment of a drug to a surface and to provide drug modification in such a way that it results in delayed drug elution, an additional test was performed. Silicon coupons approximately 1 cm by 1 cm (1 cm2) were prepared from highly polished clean semiconductor-quality silicon wafers for use as drug deposition substrates. A solution of the drug Rapamycin (Catalog number R-5000, LC Laboratories, Woburn, Mass. 01801, USA) was formed by dissolving 500 mg of Rapamycin in 20 ml of acetone. A pipette was then used to dispense approximately 5 micro-liter droplets of the drug solution onto each coupon. Following atmospheric evaporation and vacuum drying of the solution, this left approximately 5 mm diameter circular Rapamycin deposits on each of the silicon coupons. Coupons were divided into groups and either left un-irradiated (controls) or irradiated with various conditions of Neutral Beam irradiation. The groups were then placed in individual baths (bath per coupon) of human plasma for 4.5 hours to allow elution of the drug into the plasma. After 4.5 hours, the coupons were removed from the plasma baths, rinsed in deionized water and vacuum dried. Weight measurements were made at the following stages in the process: 1) pre-deposition clean silicon coupon weight; 2) following deposition and drying, weight of coupon plus deposited drug; 3) post-irradiation weight; and 4) post plasma-elution and vacuum drying weight. Thus for each coupon the following information is available: 1) initial weight of the deposited drug load on each coupon; 2) the weight of drug lost during irradiation of each coupon; and 3) the weight of drug lost during plasma elution for each coupon. For each irradiated coupon it was confirmed that drug loss during irradiation was negligible. Drug loss during elution in human plasma is shown in Table 1. The groups were as follows: Control Group—no irradiation was performed; Group 1—irradiated with a Neutral Beam derived from a GCIB accelerated with a $V_{Acc}$ of 30 kV. The Group 1 irradiated beam energy dose was equivalent to that of a 30 kV accelerated, $5\times10^{14}$ gas cluster ion per $cm^2$ dose (energy equivalence determined by beam thermal energy flux sensor); Group 2—irradiated with a Neutral Beam derived from a GCIB accelerated with a $V_{Acc}$ of 30 kV. The Group 2 irradiated beam energy dose was equivalent to that of a 30 kV accelerated, $1\times10^{14}$ gas cluster ion per cm$^2$ dose (energy equivalence determined by beam thermal energy flux sensor); and Group 3—irradiated with a Neutral Beam derived from a GCIB accelerated with a $V_{Acc}$ of 25 kV. The Group 3 irradiated beam energy dose was equivalent to that of a 25 kV accelerated, $5\times10^{14}$ gas cluster ion per cm$^2$ dose (energy equivalence determined by beam thermal energy flux sensor).

Figure 15A:
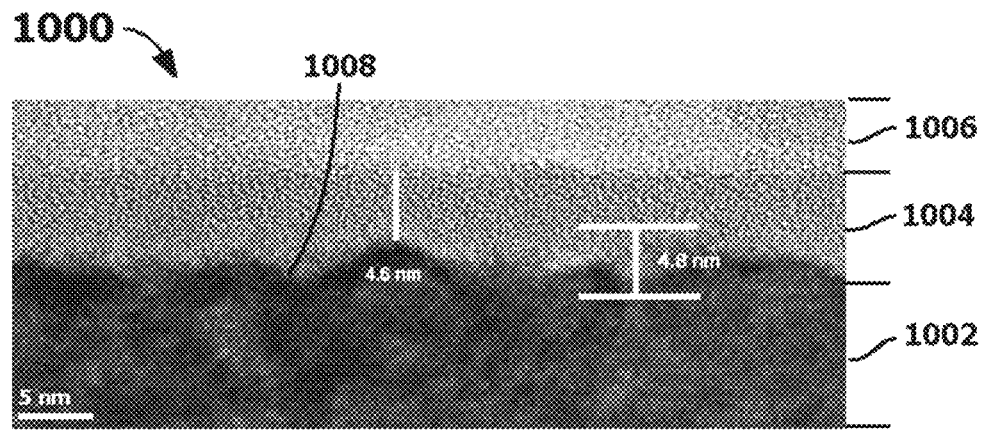
FIGS. 15A, 15B, and 15C are TEM images illustrating the superior interfaces produced when using embodiments of the invention as compared to gas cluster ion beams.

FIG. 15A is a TEM image 1000 of a section of a silicon substrate irradiated by the full GCIB (charged and neutral beam components). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1000, the epoxy overcoat 1006 is seen at the top of the image. The irradiation formed an amorphous region 1004 comprising

TABLE 1

| | | | | Group [Dose] {$V_{Acc}$} | | | | | | |
|---|---|---|---|---|---|---|---|---|---|---|
| | Contro | | | Group 1 [$5 \times 10^{14}$] {30 kV} | | | Group 2 [$1 \times 10^{14}$] {30 kV} | | | Group 3 [$5 \times 10^{14}$] {25 kV} | | |
| Coupon # | Start Load (μg) | Elution Loss (μg) | Elution Loss % | Start Load (μg) | Elution Loss (μg) | Elution Loss % | Start Load (μg) | Elution Loss (μg) | Loss % | Start Load (μg) | Elution Loss (μg) | Elution Loss % |
| 1 | 83 | 60 | 72 | 88 | 4 | 5 | 93 | 10 | 11 | 88 | — | 0 |
| 2 | 87 | 55 | 63 | 100 | 7 | 7 | 102 | 16 | 16 | 82 | 5 | 6 |
| 3 | 88 | 61 | 69 | 83 | 2 | 2 | 81 | 35 | 43 | 93 | 1 | 1 |
| 4 | 96 | 72 | 75 | — | — | — | 93 | 7 | 8 | 84 | 3 | 4 |
| Mean | 89 | 62 | 70 | 90 | 4 | 5 | 92 | 17 | 19 | 87 | 2 | 3 |
| σ | 5 | 7 | | 9 | 3 | | 9 | 13 | | 5 | 2 | |
| p value | | | | | 0.00048 | | | 0.014 | | | 0.00003 | |

Table 1 shows that for every case of Neutral Beam irradiation (Groups 1 through 3), the drug lost during a 4.5-hour elution into human plasma was much lower than for the un-irradiated Control Group. This indicates that the Neutral Beam irradiation results in better drug adhesion and/or reduced elution rate as compared to the un-irradiated drug. The p values (heterogeneous unpaired T-test) indicate that for each of the Neutral Beam irradiated Groups 1 through 3, relative to the Control Group, the difference in the drug retention following elution in human plasma was statistically significant.

Figure 15B:
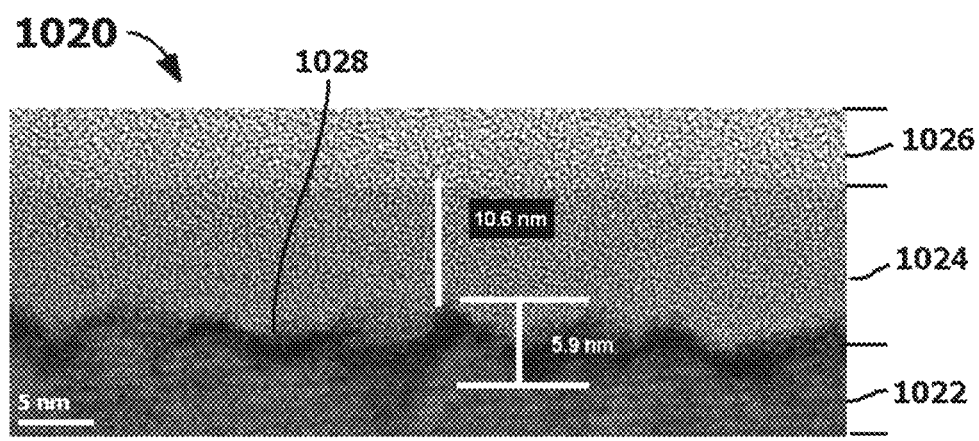
Figure 15C:
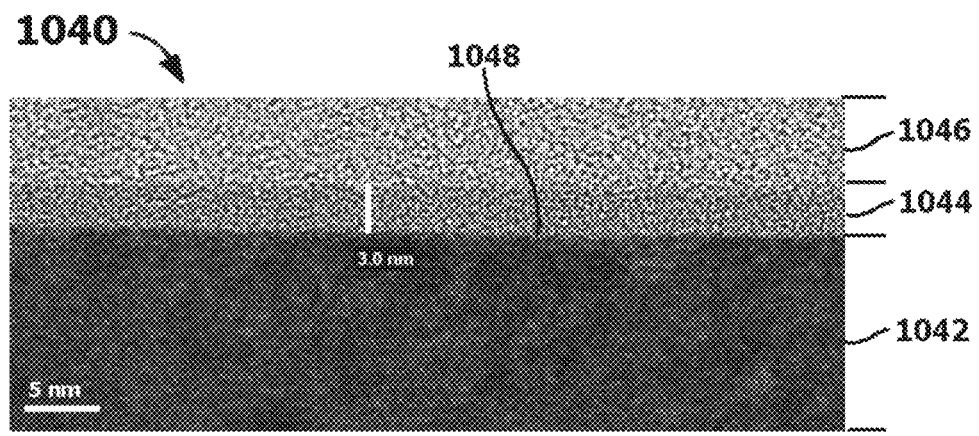

FIGS. 15A through 15C show the comparative effects of full beam (charged plus uncharged components) and charge separated beam on a single crystal silicon wafer as may be typically employed in semiconductor applications. The silicon substrate had an initial native oxide layer of approximately 1.3 nm. In separate instances, the silicon substrate was processed using a full GCIB (charged and neutral components), a Neutral Beam derived from a GCIB (charged components removed from the beam by deflection), and a charged cluster beam comprising only the charged components of a GCIB following their separation from the neutral components. All three conditions were derived from the same initial GCIB conditions, a 30 kV accelerated GCIB formed from a mixture of 98% Ar with 2% $O_2$. For each of the three beams, irradiated doses were matched to the total energy carried by the full beam (charged plus neutral) at an ion dose of $2\times10^{15}$ gas cluster ions per cm$^2$. Energy flux rates of each beam were measured using a thermal sensor and process durations were adjusted to ensure that each sample received the same total thermal energy dose equivalent to that of the full (charged plus neutral) GCIB. The three samples were evaluated by sectioning followed by imaging by transmission electron microscopy (TEM).

silicon and oxygen having a minimum thickness of approximately 4.6 nm. A rough interface 1008 having a peak-to-peak variation of approximately 4.8 nm was formed between the amorphous region 1004 and the underlying single crystalline silicon 1002, as a result of the irradiation process.

FIG. 15B is a TEM image 1020 of a section of a silicon substrate irradiated by the separated charged component of the GCIB (charged portion only). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1020, the epoxy overcoat 1026 is seen at the top of the image. The irradiation formed an amorphous region 1024 comprising silicon and oxygen having a minimum thickness of approximately 10.6 nm. A rough interface 1028 having a peak-to-peak variation of approximately 5.9 nm was formed between the amorphous region 1024 and the underlying single crystalline silicon 1022, as a result of the irradiation process.

FIG. 15C is a TEM image 1040 of a section of a silicon substrate irradiated by the neutral portion (charged components separated by deflection and discarded). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1040, the epoxy overcoat 1046 is seen at the top of the image. The irradiation formed an amorphous region 1044 comprising silicon and oxygen having a substantially uniform thickness of approximately 3.0 nm. A smooth interface 1048 having a peak-to-peak variation on an atomic scale was formed between the amorphous region 1044 and the underlying single crystalline silicon 1042, as a result of the irradiation process.

The results of processing shown in FIGS. 15A through 15C indicate that in semiconductor applications, the use of an accelerated Neutral Beam derived from accelerated GCIB by charge separation results in superior interfaces between the irradiation processed and unprocessed regions as compared to either a full GCIB or only the charged portion of a GCIB. The data also shows that a smooth uniform oxide film can be formed on silicon using a Neutral Beam derived from a GCIB and that such film is free of the rough interface often associated with the use of conventional GCIB. Without wishing to be bound to a particular theory, it is believed that the improvement likely results from the elimination of intermediate size clusters or from the elimination of all or most clusters from the beam.

Figure 16:
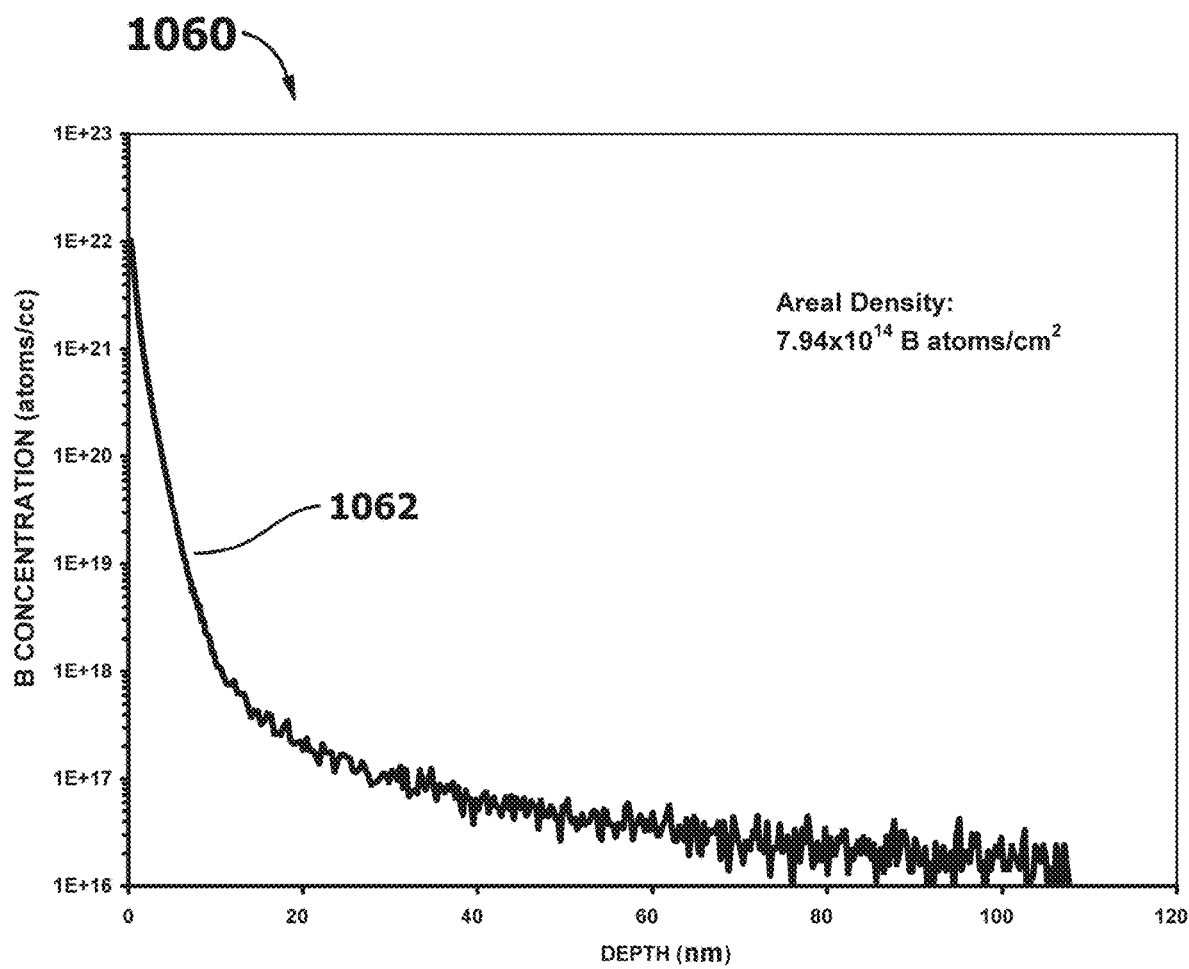
FIG. 16 is a graph showing a SIMS profile of a shallow boron implantation suitable for forming shallow junctions, using an embodiment of the invention.

FIG. 16 is a graph 1060 showing results of secondary ion mass spectrometry (SIMS) depth profile measurement of a shallow boron implantation in a silicon substrate preformed using a Neutral Beam according to an embodiment the invention. The graph plots boron concentration 1062 measured in boron atoms/cc (atoms/cm$^3$) as a function of depth measured in nm. Using apparatus similar to that shown in FIG. 4, a 30 kV accelerated GCIB was formed from a mixture of 99% Ar with 1% diborane ($B_2H_6$). Stagnation chamber pressure was 80 psi ($5.5\times10^5$ pascal), nozzle flow was 200 standard cm$^3$/minute (3.3 standard cm$^3$/sec). Full beam current (charged plus neutral components prior to separation by deflection was approximately 0.55 microA ($\mu$A). The pressure in the beam path was maintained at approximately $6.9\times10^{-5}$ torr ($9.2\times10^{-3}$ pascal) and the background gas forming that pressure was essentially argon/diborane. The argon/diborane gas target thickness for the region between the accelerator and the workpiece was approximately $2.23\times10^{14}$ argon/diborane gas monomers/cm$^2$, and the accelerated Neutral Beam was observed to consist essentially of fully dissociated neutral monomers at the target. Using electrostatic deflection, all charged particles were deflected away from the beam axis and out of the beam, forming the essentially fully dissociated Neutral Beam. Thus the Neutral Beam was an accelerated monomer neutral argon/diborane beam. Dosimetry was done using a thermal sensor to calibrate the total Neutral Beam dose delivered to the silicon substrate such that a Neutral Beam deposited energy equivalent to that energy which would be deposited by a $6.3\times10^{14}$ gas cluster ions/cm$^2$ irradiation dose by an accelerated (30 kV) GCIB including both the charged and uncharged particles (without neutralization by charge separation). The depth profile shown in FIG. 16 indicates that the Neutral Beam boron ion implantation resulting from using a Neutral Beam derived from a GCIB, results in a very shallow boron implantation. The junction depth estimated from the $10^{18}$ boron atoms/cm$^3$ concentration depth occurs at about 12 nm depth, a very shallow junction. Integrating the boron dose over depth indicates an areal density of approximately $7.94\times10^{14}$ boron atoms/cm$^2$.

Figure 17:
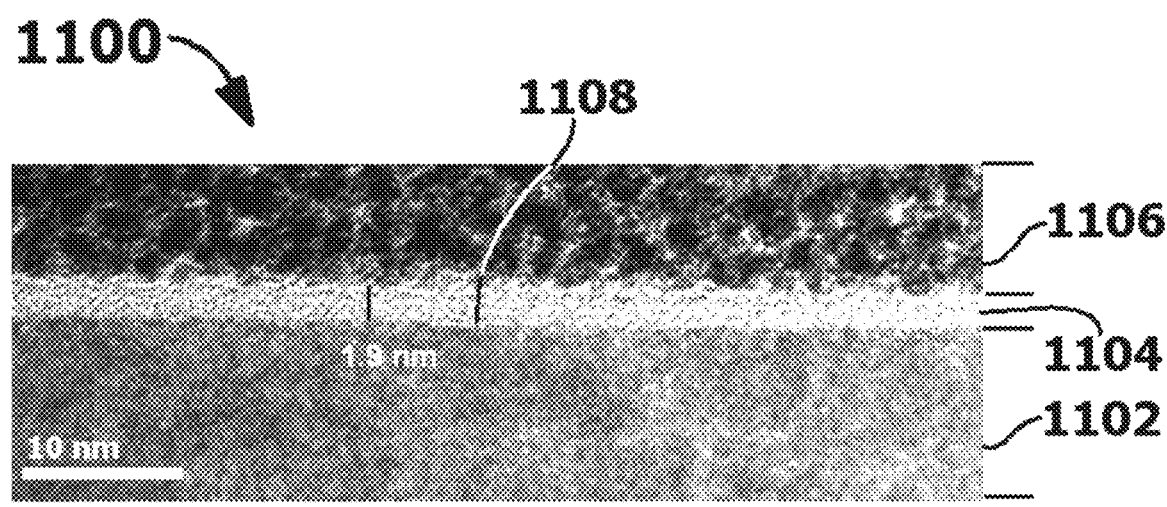
FIG. 17 is a TEM image showing a high quality interface formed when an embodiment of the invention is used in forming a boron doped semiconductor.

FIG. 17 is a TEM image 1100 of a section of a silicon substrate irradiated by the neutral portion (charged components separated by deflection and discarded) derived from a GCIB. Using apparatus similar to that shown in FIG. 4, a 30 kV accelerated GCIB was formed from a mixture of 99% Ar with 1% diborane ($B_2H_6$). Stagnation chamber pressure was 88 psi ($6.05\times10^5$ pascal), nozzle flow was 200 standard cm$^3$/minute (3.3 standard cm$^3$/sec). Full beam current (charged plus neutral components prior to separation by deflection was approximately 0.55 microA ($\mu$A). The pressure in the beam path was maintained at approximately $6.8\times10^{-5}$ torr ($9.07\times10^{-3}$ pascal) and the background gas forming that pressure was essentially argon/diborane. The argon/diborane gas target thickness for the region between the accelerator exit aperture and the workpiece was therefore approximately $2.2\times10^{14}$ argon/diborane gas monomers/cm$^2$, and the accelerated Neutral Beam was observed to consist essentially of fully dissociated neutral monomers at the target. Using electrostatic deflection all charged particles were deflected away from the beam axis and out of the beam, forming a Neutral Beam, which was essentially fully dissociated. Thus the Neutral Beam was an accelerated monomer neutral argon/diborane beam. Dosimetry was done using a thermal sensor to calibrate the total Neutral Beam dose delivered to the silicon substrate such that a Neutral Beam deposited energy equivalent to that energy which would be deposited by a $1.8\times10^{14}$ gas cluster ions/cm$^2$ irradiation dose by an accelerated (30 kV) GCIB including both the charged and uncharged particles (without neutralization by charge separation). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. Referring again to FIG. 17, in the TEM image 1100, the epoxy overcoat 1106 is seen at the top of the image. The irradiation formed an amorphous region 1104 comprising silicon and boron having a substantially uniform thickness of approximately 1.9 nm. A smooth interface 1108 having a peak-to-peak variation on an atomic scale was formed between the amorphous region 1104 and the underlying single crystalline silicon 1102, as a result of the irradiation process. Prior art GCIB irradiation of semiconductor materials for introducing dopants, strain inducing species, etc. are known to form rougher interfaces between the processed film and the underlying substrate, similar to the interface 1008 shown in FIG. 15A. It is shown that diborane can be employed to effectively dope a semiconductor with boron, with a high quality interface between the doped film and the underlying substrate. By using other gases containing other dopant and/or lattice-straining species, species for increasing the solid solubility limit of a dopant, or species for promoting surface amorphization, high quality films with superior interfaces between film and substrate may be obtained as compared to conventional GCIB technology, where the presence of intermediate-sized cluster ions in the beam may result in a rough interface. Some dopant-containing gases that may be employed alone or in mixtures for introducing dopants are, diborane ($B_2H_6$), boron trifluoride ($BF_3$), phosphine ($PH_3$), phosphorous pentafluoride ($PF_5$), arsine ($AsH_3$), and arsenic pentafluoride ($AsF_5$), as examples without limitation, may be employed for incorporating dopant atoms into gas clusters. Some gases that may be employed alone or in mixtures for introducing lattice-straining species are germane ($GeH_4$), germanium tetrafluoride ($GeF_4$), silane ($SiH_4$), silicon tetrafluoride ($SiF_4$), methane, ($CH_4$). Some gases that may be employed alone or in mixtures for promoting amorphization are, without limitation, argon (Ar), germane ($GeH_4$), germanium tetrafluoride ($GeF_4$), and fluorine ($F_2$). Some gases that may be employed alone or in mixtures for promoting dopant solubility are germane ($GeH_4$) and germanium tetrafluoride ($GeF_4$). Dopant-containing gases, gases containing lattice-straining species, gases containing amorphizing species, and/or gases containing species for improving dopant solubility (and optionally inert or other gases) may be employed in mixtures for simultaneous formation of combinations of benefits by the accelerated Neutral Beam process. In FIG. 17, the lead line connecting the numeric designator 1108 to its object changes color to maintain contrast on regions in the figure having differing backgrounds.

Figure 18:
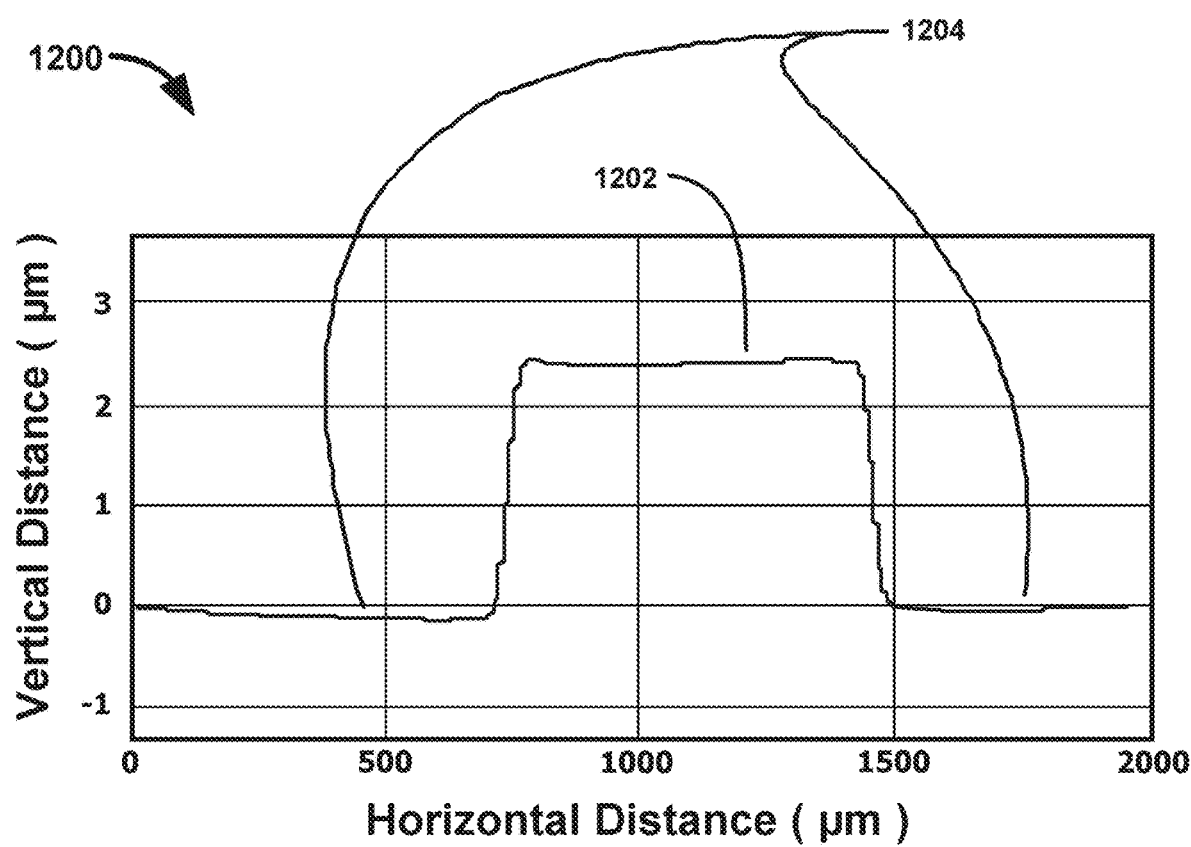
FIG. 18 is a graph illustrating the etching of $SiO_2$ and Si using an embodiment of the invention.

FIG. 18 illustrates a depth profile measurement graph 1200 obtained after using an accelerated Neutral Beam derived from a GCIB to etch a silicon dioxide ($SiO_2$) film on a silicon substrate and to etch the silicon substrate. Using apparatus similar to that shown in FIG. 4, a 30 kV accelerated GCIB was formed using argon. Stagnation chamber pressure was 28 psi ($1.93 \times 10^5$ pascal), nozzle flow was 200 standard $cm^3$/minute (3.3 standard $cm^3$/sec). Full beam current (charged plus neutral components prior to separation by deflection was approximately 0.50 microA (μA). The argon gas target thickness for the region between the accelerator and the workpiece was approximately $1.49 \times 10^{14}$ argon gas monomers/$cm^2$, and the accelerated Neutral Beam was observed to consist essentially of fully dissociated neutral monomers at the target. Using electrostatic deflection all charged particles were deflected away from the beam axis and out of the beam, forming a Neutral Beam. Thus the Neutral Beam was essentially an accelerated neutral argon monomer beam. Dosimetry was done using a thermal sensor to calibrate the total Neutral Beam dose delivered to the silicon substrate such that a Neutral Beam deposited energy equivalent to that energy which would be deposited by a $2.16 \times 10^{16}$ gas cluster ions/$cm^2$ irradiation dose by an accelerated (30 kV) GCIB including both the charged and uncharged particles (without neutralization by charge separation). A silicon dioxide ($SiO_2$) film (approximately 0.5 micron [μm] thick) on a silicon substrate was partially masked with a narrow (approximately 0.7 mm wide) strip of polyimide film tape and then irradiated with the accelerated Neutral Beam. Following the irradiation the polyimide tape was removed. Referring again to FIG. 18, the depth profile measurement graph 1200 was generated using a TENCOR Alpha-Step 250 profilometer to measure the step profile, in a direction along the surface of the $SiO_2$ film (on silicon substrate) and across the region masked by the polyimide film tape, due to the etching resulting from the accelerated Neutral Beam. Plateau 1202 represents the unetched surface of the $SiO_2$ film beneath the polyimide film (after film removal and cleaning), while the regions 1204 represent the etched portion. The accelerated Neutral Beam produced an etch depth of approximately 2.4 microns (μm), etching all the way through the 0.5 micron $SiO_2$ film and an additional 1.9 microns into the underlying crystalline silicon substrate, producing the step shown in depth profile measurement graph 1200. Argon and other inert gases may be used as source gases to etch by physical means. By using a reactive source gas or using a source gas incorporating a reactive gas in a mixture, reactive etching can also be performed using a Neutral Beam. Typical reactive gases that may be used alone or in mixture with inert gases are (without limitation) oxygen ($O_2$), carbon dioxide ($CO_2$), nitrogen ($N_2$), ammonia ($NH_3$), fluorine ($F_2$), chlorine ($Cl_2$), sulfur hexafluoride ($SF_6$), tetrafluoromethane ($CF_4$), and other condensable halogen-containing gases.

Figure 19A:
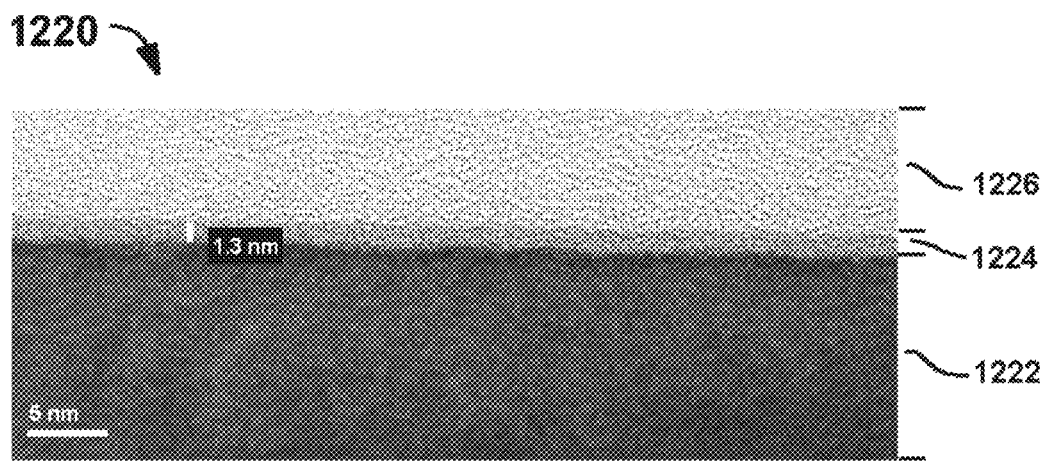
FIGS. 19A and 19B are TEM images illustrating the use of embodiments of the invention in forming amorphous layers in semiconductor materials.
Figure 19B:
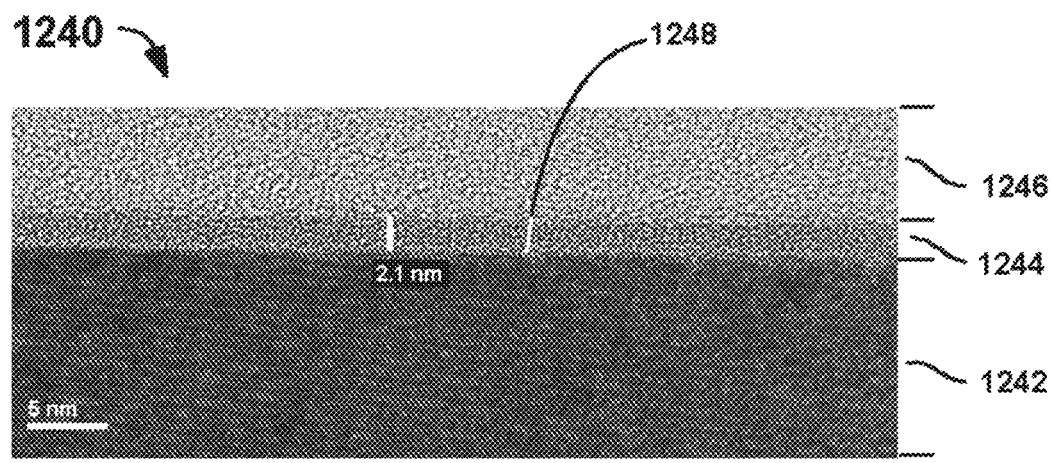

FIGS. 19A and 19B are TEM images illustrating production of amorphous layers in crystalline semiconductor material by irradiating with accelerated Neutral Beams derived from GCIBs. Prior to sectioning for TEM imaging, the top surface of each sample was coated with an epoxy overcoat to facilitate the sectioning operation and to avoid damage to the surface during the sectioning process. Native oxide forms spontaneously in air or water when bare silicon is exposed.

FIG. 19A is a TEM image 1220 of a section of a silicon substrate with a film of native $SiO_2$. In the TEM image 1220, the epoxy overcoat 1226 is seen at the top of the image. A thin (approximately 1.3 nm) native oxide film 1224 is seen on the underlying silicon substrate 1222.

FIG. 19B is a TEM image 1240 showing results of irradiation of a silicon substrate by an accelerated argon Neutral Beam derived from a GCIB. A silicon wafer having a native oxide film similar to that shown in FIG. 19A was cleaned in 1% aqueous solution of hydrofluoric acid to remove the native oxide. The cleaned silicon substrate was irradiated using a Neutral Beam derived from a 30 kV accelerated GCIB (charged components removed from the beam by deflection) formed from argon. The irradiated dose was matched in energy to the total energy carried by a full beam (charged plus neutral) at an ion dose of $5 \times 10^{14}$ gas-cluster ions per $cm^2$ by using a thermal sensor to match the total energy deposited by the Neutral Beam to that of the full $5 \times 10^{14}$ gas-cluster ions per $cm^2$ beam. Referring again to FIG. 19B, the TEM image 1240 shows the epoxy overcoat 1246, a 2.1 nm thick amorphous film 1244 in the surface of the silicon formed by the accelerated Neutral Beam irradiation, overlying the crystalline silicon substrate material 1242. A smooth interface 1248 having a peak-to-peak variation on an atomic scale was formed between the amorphous film 1244 and the underlying crystalline silicon material 1242, as a result of the irradiation process. This shows that the noble gas, argon (Ar), may be employed to form an amorphous layer in a crystalline semiconductor material. Some other gases (without limitation) that may be used to form amorphous layers by employing them in formation of the accelerated Neutral Beams of the invention include, xenon (Xe), germane ($GeH_4$), and germanium tetrafluoride ($GeF_4$). Such source gases may be used alone or in mixtures with argon or other noble gases. In FIG. 19B, the lead line connecting the numeric designator 1248 to its object changes color to maintain contrast on regions in the figure having differing backgrounds.

Figure 20A:
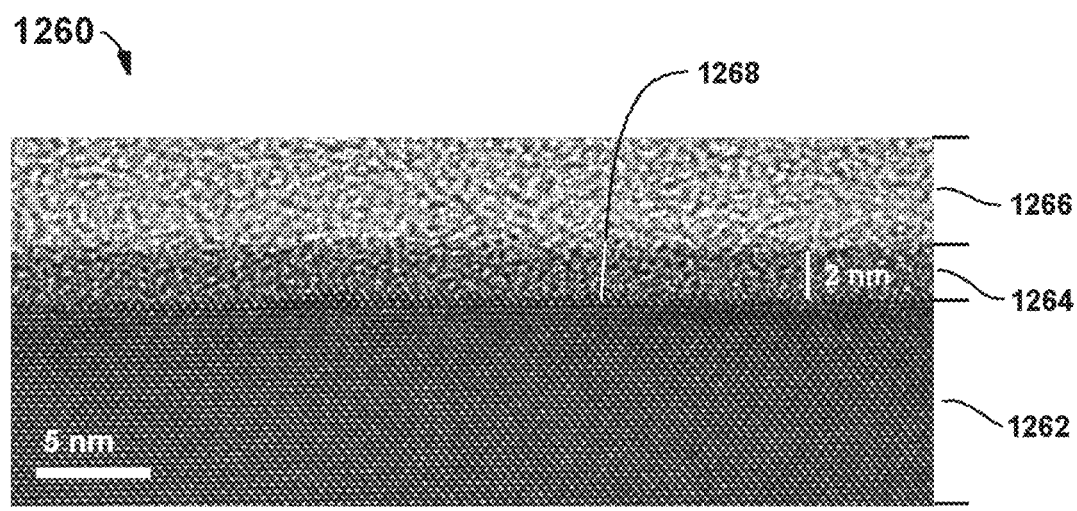
FIGS. 20A and 20B are TEM images illustrating the application of accelerated Neutral Beams derived from GCIBs for forming films in semiconductors.
Figure 20B:
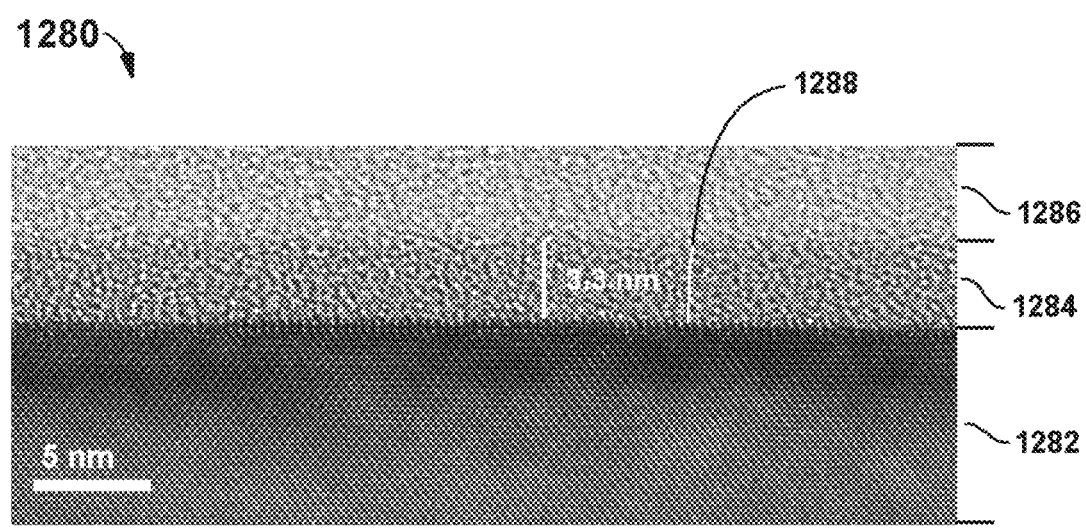

FIGS. 20A and 20B are TEM images illustrating the growth of an oxide film on silicon by the use of accelerated Neutral Beams derived from GCIBs. Prior to sectioning for TEM imaging, the top surface of each sample was coated with an epoxy overcoat to facilitate the sectioning operation and to avoid damage to the surface during the sectioning process.

FIG. 20A is a TEM image 1260 showing results of irradiation of a silicon substrate by an accelerated Neutral Beam derived from a GCIB. A silicon wafer having a native oxide film similar to that shown in FIG. 19A was cleaned in 1% aqueous solution of hydrofluoric acid to remove the native oxide. The cleaned, bare silicon substrate was then irradiated using a Neutral Beam derived from a 30 kV accelerated GCIB (charged components removed from the beam by deflection) formed from a source gas mixture of 98% Ar with 2% $O_2$. The irradiated Neutral Beam dose was energetically equivalent (energy equivalence determined by beam thermal energy flux sensor) to a 30 kV accelerated GCIB at an ion dose of $2.4 \times 10^{13}$ gas cluster ions per $cm^2$. Referring again to FIG. 20A, the TEM image 1260 shows the epoxy overcoat 1266, a 2 nm thick oxide film 1264 in the surface of the silicon formed by the accelerated Neutral Beam irradiation, overlying the crystalline silicon substrate material 1262. A smooth interface 1268 having a peak-to-peak variation on an atomic scale was formed between the oxide film 1264 and the underlying crystalline silicon material 1262, as a result of the irradiation process. In FIG. 20A, the lead line connecting the numeric designator 1268 to its object changes color to maintain contrast on regions in the figure having differing backgrounds.

FIG. 20B is a TEM image 1280 showing results of irradiation of a silicon substrate by an accelerated Neutral Beam derived from a GCIB. A silicon wafer having a native oxide film similar to that shown in FIG. 19A was cleaned in 1% aqueous solution of hydrofluoric acid to remove the native oxide. The cleaned, bare silicon substrate was then irradiated using a Neutral Beam derived from a 30 kV accelerated GCIB (charged components removed from the beam by deflection) formed from a source gas mixture of 98% Ar with 2% $O_2$. The irradiated Neutral Beam dose was energetically equivalent (energy equivalence determined by beam thermal energy flux sensor) to a 30 kV accelerated GCIB at an ion dose of $4.7 \times 10^{14}$ gas cluster ions per $cm^2$. Referring again to FIG. 20B, the TEM image 1280 shows the epoxy overcoat 1286, a 3.3 nm thick oxide film 1284 in the surface of the silicon formed by the accelerated Neutral Beam irradiation, overlying the crystalline silicon substrate material 1282. A smooth interface 1288 having a peak-to-peak variation on an atomic scale was formed between the oxide film 1284 and the underlying crystalline silicon material 1282, as a result of the irradiation process. This shows that a Neutral Beam comprising oxygen may be employed to form an oxide layer at the surface of a semiconductor material. The thickness of the film grown may be varied by varying the irradiated dose. By using source gases comprising other reactive species in forming the accelerated Neutral Beam, other types of films may be grown on semiconductor or other surfaces, for examples (without limitation), oxygen ($O_2$), nitrogen ($N_2$), or ammonia ($NH_3$), alone or in mixture with argon (Ar) or other noble gas may be employed. In FIG. 20B, the lead line connecting the numeric designator 1288 to its object changes color to maintain contrast on regions in the figure having differing backgrounds.

Figure 21:
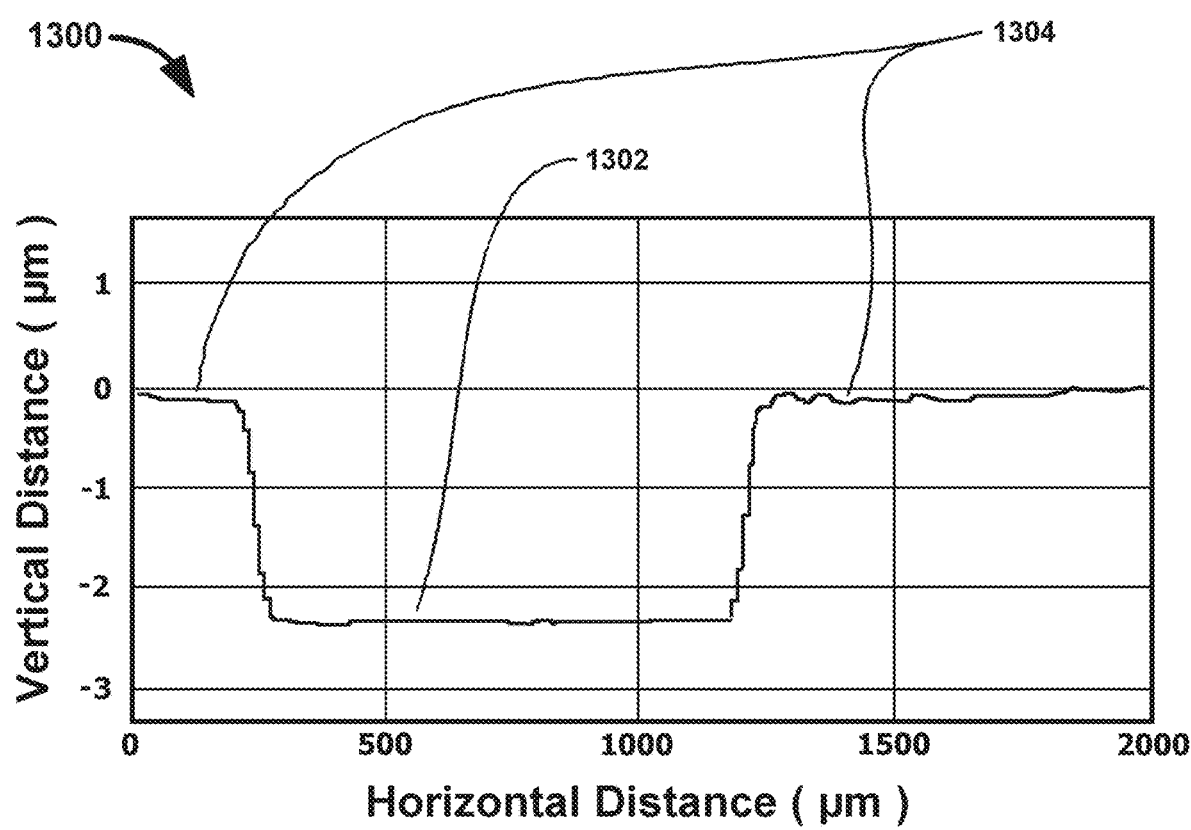
FIG. 21 is a graph illustrating the deposition of a diamond-like carbon film on a silicon substrate using an accelerated Neutral Beam derived from an accelerated GCIB.

FIG. 21 illustrates a depth profile measurement graph 1300 obtained after using an accelerated Neutral Beam derived from a GCIB to deposit a diamond-like carbon film on a silicon substrate. Using apparatus similar to that shown in FIG. 4, a 30 kV accelerated GCIB was formed using a source gas mixture of 10% methane ($CH_4$) with 90% argon. The accelerated Neutral Beam was observed to consist essentially of fully dissociated neutral monomers at the target. Using electrostatic deflection all charged particles were deflected away from the beam axis and out of the beam, forming a neutral methane/argon beam. Thus the Neutral Beam was essentially an accelerated neutral methane/argon monomer beam. Dosimetry was done using a thermal sensor to calibrate the total Neutral Beam delivered to the silicon substrate such that the Neutral Beam deposited energy equivalent to that energy which would be deposited by a 2.8 microA gas cluster ions/$cm^2$ irradiation dose by an accelerated (30 kV) GCIB, including both the charged and uncharged particles (without neutralization by charge separation). A silicon substrate was partially masked with a narrow (approximately 1 mm wide) strip of polyimide film tape and then the substrate and mask were irradiated with the accelerated Neutral Beam for 30 minutes, depositing a diamond-like carbon film. Following irradiation the mask was removed. Referring again to FIG. 21, the depth profile measurement graph 1300 was generated using a TENCOR Alpha-Step 250 profilometer to measure the step profile, in a direction along the surface of the silicon substrate and across the region masked by the polyimide film tape, due to the deposition resulting from the accelerated Neutral Beam. Flat region 1302 represents the original surface of the silicon substrate beneath the polyimide film (after film removal and cleaning), while the regions 1304 represent the deposited diamond-like carbon portion. The accelerated Neutral Beam produced a deposition thickness of approximately 2.2 microns (μm), producing the step shown in depth profile measurement graph 1300. The deposition rate was approximately 0.45 nm/sec for each microA/$cm^2$ of GCIB current (the energetic equivalent, as determined by thermal sensor as mentioned above in this paragraph). In other tests, 5% mixture and 7.5% mixtures of $CH_4$ in argon, gave similar results, but with lower deposition rates resulting from lower $CH_4$ percentage in the source gas. Selection of gas mixture and dose permit repeatable deposition of films with predetermined thicknesses. $CH_4$, alone or in mixture with argon or other noble gas is an effective source gas for depositing carbon using an accelerated neutral monomer beam. Other typical gases that may be used alone or in mixture with inert gases for film deposition using accelerated neutral monomer beams are (without limitation) germane ($GeH_4$), germanium tetrafluoride ($GeF_4$), silane ($SiH_4$), and silicon tetrafluoride ($SiF_4$).

FIGS. 22A, 22B, 22C, and 22D are schematics illustrating the use of embodiments of the invention for processing trenches using an accelerated Neutral Beam derived from an accelerated GCIB.

Figure 22A:
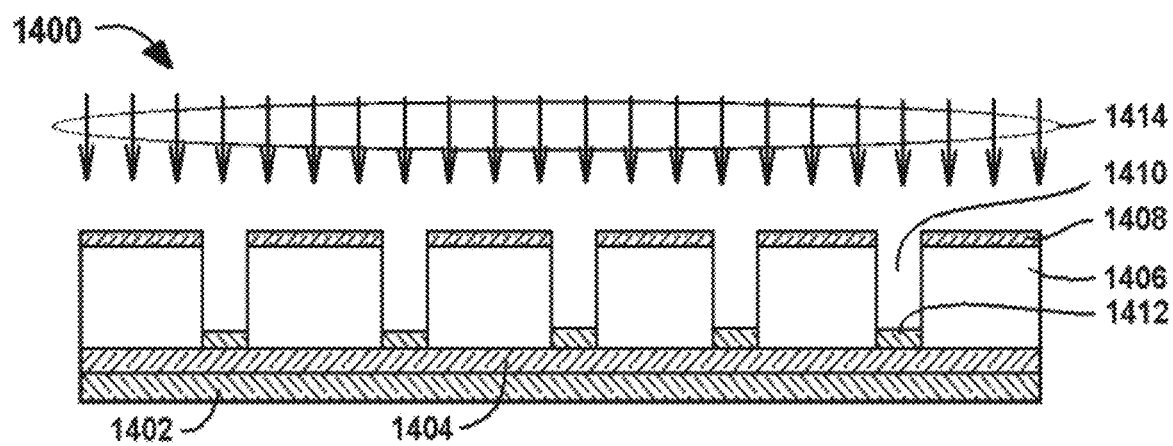
FIGS. 22A, 22B, 22C, and 22D are schematics illustrating the use of embodiments of the invention for processing trenches using an accelerated Neutral Beam derived from an accelerated GCIB.

FIG. 22A is a schematic 1400 of a substrate 1402 having a layer 1404 (for example a device layer) and a structure layer 1406 having structures that are trenches 1410 within the structure layer 1406. The trenches have substantially parallel sidewalls and the sidewalls of all trenches 1410 are substantially mutually parallel. Several identical trench structures are shown, but only the rightmost trench structure 1410 is labeled. Each trench structure 1410 has a base or bottom comprising base or bottom material 1412. A mask material 1408 defines openings in the trench structures 1410. The schematic 1400 is not necessarily drawn to scale. A Neutral Beam 1414 is mechanically scanned across the upper surface of the entire structure. Preferably, but optionally, the beam 1414 is directed and aligned so as to be parallel to the sidewalls of the trenches 1410. The mechanically scanned (and preferably directed or aligned with sidewalls) beam 1414 travels through openings in the mask material 1408, between and parallel to the sidewalls of the trenches 1410 and irradiates the base or bottom material 1412. The base or bottom material is irradiated by the Neutral Beam 1414 and is modified by it. The Neutral beam 1414, traveling substantially parallel to the sidewalls has low emittance, low divergence and is substantially free of interaction with the sidewalls of the trenches 1410. Depending on the base or bottom material 1412 and depending on the constituent precursor gases of the beam 1414, the beam 1414 may be inert, chemically reactive with the base or bottom material, or may be relatively refractory, and thus may modify the base or bottom material 1412 by sputtering, physical etching, reactive etching, amorphization, deposition, epitaxial growth, implantation, or otherwise. The amount of such modification can be influenced by selection of beam 1414 energy and processing dose.

Figure 22B:
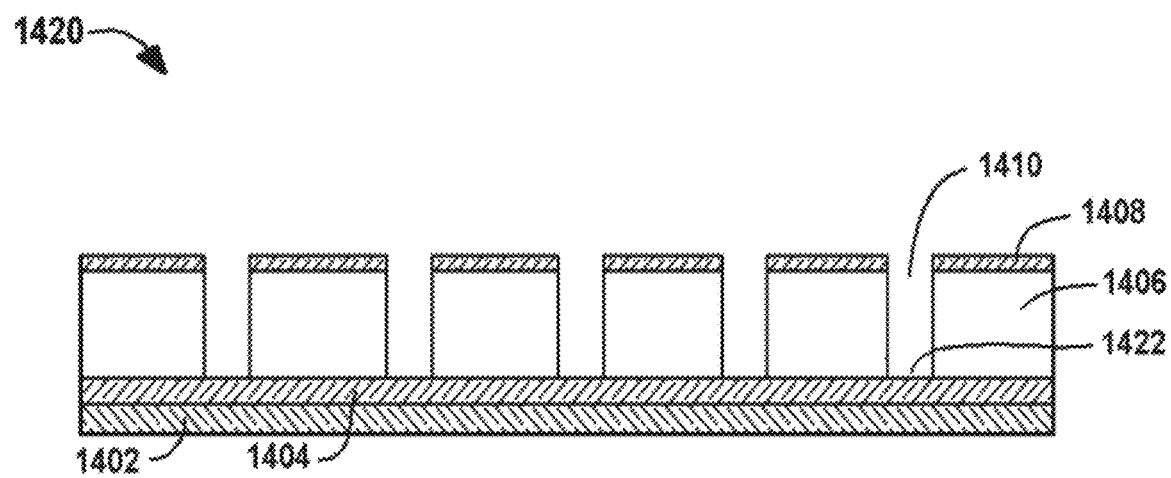

FIG. 22B is a schematic 1420 showing the substrate 1402 following irradiation as shown in FIG. 22A. For this example, shown in FIG. 22B, the previous processing was an etching process that etched away the base or bottom material 1414 (of FIG. 22A), exposing new base or bottom material 1422, which is a constituent of layer 1404 (for example a device layer.) Layer 1404 might be a semiconductor material, metal material, ceramic, oxide, or other material. Layer 1404 may be a crystalline or non-crystalline material, and thus the new base or bottom material now exposed would be the same material as the layer 1404.

Figure 22C:
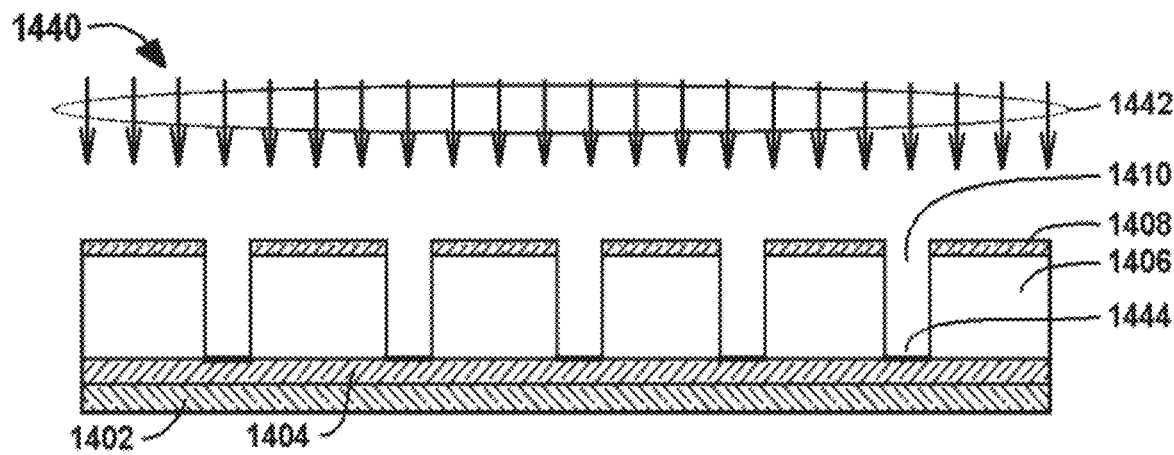

FIG. 22C is a schematic 1440 showing the substrate 1402 in a subsequent step where the new base or bottom material 1422 (from FIG. 22B) being irradiated by a second Neutral Beam 1442. The second Neutral Beam 1442 is mechanically scanned across the upper surface of the entire structure. Preferably, but optionally, the beam 1442 is directed and aligned so as to be parallel to the sidewalls of the trenches 1410. The mechanically scanned (and preferably directed or aligned with sidewalls) beam 1442 travels through openings in the mask material 1408, between and parallel to the sidewalls of the trenches 1410 and irradiates the new base or bottom material 1422 (from FIG. 22B). The new base or bottom material 1422 is irradiated by the Neutral Beam 1442 and is modified by it. The Neutral beam 1442, traveling substantially parallel to the sidewalls has low emittance, low divergence and is substantially free of interaction with the sidewalls of the trenches 1410. Depending on the base or bottom material 1422 and depending on the constituent precursor gases of the beam 1442, the beam 1442 may be inert, chemically reactive with the base or bottom material, or may be relatively refractory, and thus may modify the base or bottom material 1422 by sputtering, physical etching, reactive etching, amorphization, implantation, or otherwise. The amount of such modification can be influenced by selection of beam 1414 energy and processing dose. In the case where the new base or bottom material 1422 is a crystalline material, and when Neutral Beam 1442 constituents, energy and dose are chosen for amorphization, the crystalline base or bottom material 1422 will form a thin amorphized layer 1444 in the layer 1404 at the base or bottom of the trench 1410.

Figure 22D:
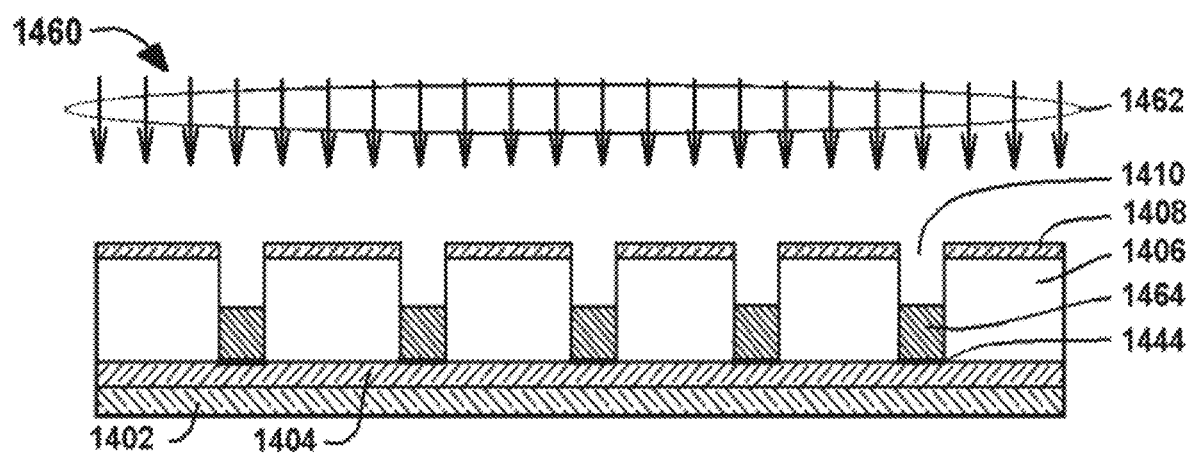

FIG. 22D is a schematic housing apparatus 1460 showing the substrate 1402 in a subsequent step, where the crystalline base or bottom material 1422 (from FIG. 22B) has formed on it a thin amorphized layer 1444 in the layer 1404 at the base or bottom of the trench 1410. In this subsequent step, amorphized layer 1444 (from FIG. 22C) is being irradiated by a third Neutral Beam 1462. The third Neutral Beam 1462 is mechanically scanned across the upper surface of the entire structure. Preferably, but optionally, the beam 1462 is directed and aligned so as to be parallel to the sidewalls of the trenches 1410. The mechanically scanned (and preferably directed or aligned with sidewalls) beam 1462 travels through openings in the mask material 1408, between and parallel to the sidewalls of the trenches 1410 and irradiates the amorphized layer 1444. The amorphized layer 1444 is irradiated by the Neutral Beam 1462 and is modified by it. In the case where the Neutral Beam 1462 constituents, energy and dose are chosen for deposition or epitaxial growth, the amorphized layer 1444 serves as a base for deposition or epitaxial growth, and a deposited layer or epitaxially grown layer 1464 is formed at the bottom of the trench 1410 upon the amorphous layer 1444 in the layer 1404, which serves as a matching or interface layer for the deposited or epitaxially grown layer 1464 at the bottom of the trench 1410.

The use of an accelerated Neutral Beam derived from an accelerated GCIB by separation of charged components from uncharged components is shown to be capable of numerous applications in the field of semiconductor processing, with an added benefit that the interface between the layer formed by the irradiation and the underlying semiconductor is extremely smooth and superior to results obtained by conventional GCIB irradiation.

Although the invention has been described with respect to silicon semiconductor materials, it is understood by the inventors that it is equally applicable to other semiconductor materials including germanium, and compound semiconductors including, without limitation, group III-V and group II-VI and related materials and it is intended that the scope of the invention is intended to include those materials.

It is understood by the inventors that although the invention has been shown for exemplary purposes to be useful for processes such a smoothing, etching, film growth, film deposition, amorphization, and doping by using silicon semiconductor wafers, it is understood by the inventors that the benefits of the invention are not limited only to processes done on bare semiconductor surfaces, but are equally useful for processing portions of electrical circuits, electrical devices, optical elements, integrated circuits, micro-electrical mechanical systems (MEMS) devices (and portions thereof) and other devices that are commonly constructed using conventional modern technologies on silicon substrates, other semiconductor substrates, and substrates of other materials, and it is intended that the scope of the invention includes such applications.

Although the benefits of applying the Neutral Beam of the invention for electrical charging-free processing have been described with respect to processing various electrically insulating and/or non-electrically-conductive materials such as insulating drug coatings, dielectric films such as oxides and nitrides, insulating corrosion inhibitor coatings, polymers, organic films, glasses, ceramics, it is understood by the inventors that all materials of poor or low electrical conductivity may benefit from using the Neutral Beam of the invention as a substitute for processing with charge transferring processing techniques like ion beams, plasmas, etc., and it is intended that the scope of the invention includes such materials. It is further understood by the inventors that Neutral Beam processing is advantageous not only because of its reduced charging characteristics, but also for processing many materials that are electrically conductive, where other advantages of Neutral Beam processing, especially neutral monomer beam processing, which produces less surface damage, better smoothing, and smoother interfaces between processed and underlying unprocessed regions, even in metals and highly conductive materials. It is intended that the scope of the invention includes processing of such materials.

Although the benefits of applying the Neutral Beam of the invention for electrical charging-free processing have been described with respect to processing various insulating and/or non-electrically-conductive materials, it is understood by the inventors that the charge-free Neutral Beam processing benefits apply equally to the processing of electrically conductive, semiconductive, or slightly conductive materials that exist in the form of coatings or layers or other forms overlying insulating layers or disposed upon insulating substrates, wherein the at least slightly conductive materials have no reliable ground connection or other pathway for removing surface charges that may be induced by processing using charge transferring processing techniques. In such cases, charging of the at least slightly conductive materials during processing may produce damage to those materials or to the underlying insulating materials. The charging and damage may be avoided by using the Neutral Beam processing of the invention. It is intended by the inventors that the scope of the invention includes processing of such dissimilar material arrangements where an at least slightly conductive material overlays an insulating material.

Although the invention has been described with respect to various embodiments, it should be realized this invention is also capable of a wide variety of further and other embodiments within the spirit and scope of the invention.

REFERENCES

[1] J. W. Coburn, H. F. Winters, *J. Appl. Phys.* 50, 3189 (1979)

[2] N. Negashi, M. Izawa, K. Yokogawa, Y. Momonoi, T. Yoshida, K. Nakaune, H. Kawahara, M. Kojima, K. Tsujimoto, S. Tachi: Proc. Symp. Dry Process, p. 31 (2000)

[3] K. Tsunokuni, K. Nojiri, S. Kuboshima, K. Hirobe: Ext. Abstr. $19^{th}$ Conf. Solid State Devices and Materials, p. 195 (1987)

[4] A. Kirkpatrick, S. Kirkpatrick, M. Walsh, S. Chau, M. Mack, S. Harrison, R. Svrluga, J. Khoury, "Investigation of accelerated neutral atom beams created from gas cluster ion beams," *Nucl. Instr. Meth. Phys. Res. B* 307 (2013) 291

[5] B. W. van der Waal, *J. Chem. Phys.* 90, 3407 (1989)

The invention claimed is:

1. A method for processing a trench structure having a proximate opening and a distal base or bottom material therein having an exposed surface deep within the trench accessible through said opening via the trench structure with an aspect ratio, within a range 5:1 to 200:1:

providing a reduced pressure chamber;

forming a gas cluster ion beam comprising gas cluster ions within the reduced pressure chamber;

accelerating and focusing the gas cluster ions to form an accelerated and focused gas cluster ion beam along a beam path within the reduced pressure chamber;

promoting fragmentation and/or dissociation of at least a portion of the accelerated gas cluster ions along the beam path by increasing the range of velocities of ions in the accelerated gas cluster ion beam while substantially maintaining focus of the gas cluster ion beam;

removing charged particles from the beam path to form an accelerated and focused neutral beam along the beam path in the reduced pressure chamber;

holding a workpiece constituting all or part of the base or bottom material of the trench structure in the beam path to direct the neutral beam path through the trench structure opening and to the exposed surface of the base or bottom material; and treating the base or bottom material exposed surface by irradiating the exposed surface with the accelerated and focused neutral beam.

2. The method of claim 1, wherein at least a portion of the base or bottom material is removed by the step of treating.

3. The method of claim 2 wherein the at least a portion of the base or bottom material is removed by etching, sputtering, reactive etching, or inert etching.

4. The method of claim 1, wherein the step of treating grows an epitaxial layer on the base or bottom material.

5. The method of claim 1, wherein the base or bottom material is at least partially crystalline, and further wherein the step of treating results in formation of an amorphized layer.

6. The method of claim 4, wherein the treated base or bottom material has exposed dangling bonds.

7. The method of claim 5, further wherein the amorphized layer is an oxidized amorphous layer.

8. The method of claim 1, wherein the step of treating deposits a dissimilar material onto the base or bottom material.

9. The method of claim 1, wherein the irradiating step further includes the step of directing or aligning the accelerated neutral beam with a feature of the trench to facilitate anisotropic processing of the base or bottom surface.

10. A semiconductor material with a surface as processed by treatment per the method of claim 1.

11. A dielectric material with a surface as processed by treatment per the method of claim 1.

12. A metallic material with a surface as processed by treatment per the method of claim 1.

13. A ceramic material with a surface as processed by treatment per the method of claim 1.

* * * * *